(12) United States Patent
Gudeman et al.

(10) Patent No.: US 7,042,611 B1
(45) Date of Patent: May 9, 2006

(54) PRE-DEFLECTED BIAS RIBBONS

(75) Inventors: Christopher Gudeman, Los Gatos, CA (US); Omar Leung, Palo Alto, CA (US); James Hunter, Campbell, CA (US); David Amm, Sunnyvale, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 531 days.

(21) Appl. No.: 10/378,710

(22) Filed: Mar. 3, 2003

(51) Int. Cl.
*G02B 26/00* (2006.01)
*G02B 26/08* (2006.01)
*G02B 5/18* (2006.01)
*G09G 3/34* (2006.01)
*H01L 21/00* (2006.01)

(52) U.S. Cl. .................. 359/237; 359/290; 359/291; 359/224; 359/571; 359/572; 359/573; 345/84; 345/87; 345/108; 438/24; 216/24

(58) Field of Classification Search ............ 359/290, 359/291, 295, 298, 237, 223, 224, 571, 572, 359/573; 345/84, 87, 108; 438/24, 50, 64; 216/2, 24
See application file for complete search history.

(56) References Cited

U.S. PATENT DOCUMENTS

| 1,525,550 | A | 2/1925 | Jenkins | |
|---|---|---|---|---|
| 1,548,262 | A | 8/1925 | Freedman | |
| RE16,767 | E | 10/1927 | Jenkins | |
| 1,814,701 | A | 7/1931 | Ives | |
| 2,415,226 | A | 2/1947 | Sziklai | ........ 178/5.4 |

(Continued)

FOREIGN PATENT DOCUMENTS

| DE | 32 33 195 A1 | 3/1983 |
|---|---|---|
| DE | 43 23 799 A1 | 1/1994 |
| DE | 197 23 618 A1 | 12/1997 |

(Continued)

OTHER PUBLICATIONS

D. Rowe, "Laser Beam Scanning," SPIE, vol 2008, Oct. 5, 1993, 18–26.

L. Hornbeck, "Deformable–Mirror Spatial Light Modulators," *Spatial Light Modulators and Applications III*, Aug. 8, CA 1989, pp. 86–102.

Russick et al., "Supercritical Carbon Dioxide Extraction of Solvent from Micromachined Structures," Supercritical Fluids, Chapter 18, American Chemical Society, pp 255–269, 1997.

(Continued)

*Primary Examiner*—Loha Ben
(74) *Attorney, Agent, or Firm*—Okamoto & Benedicto LLP

(57) ABSTRACT

A modulator for and a method of modulating an incident beam of light including means for supporting a plurality of active elements and a plurality of bias elements, each active and bias element including a light reflective planar surface with the light reflective planar surfaces of the plurality of active elements lying in a first parallel plane and the plurality of bias elements lying in a second parallel plane wherein the plurality of active and bias elements are parallel to each other and further wherein the plurality of bias elements are mechanically or electrically deflected with respect to the plurality of active elements. Each of the plurality of bias elements is deflected an odd multiple of the wavelength of an incident light wave divided by four and the plurality of light reflective planar surfaces of the plurality of active elements move between the first parallel plane to the second parallel plane. The deflection of bias elements is optimized to minimize optical attenuation error due to voltage error.

25 Claims, 13 Drawing Sheets

U.S. PATENT DOCUMENTS

| | | | |
|---|---|---|---|
| 2,783,406 A | 2/1957 | Vanderhooft | 313/70 |
| 2,920,529 A | 1/1960 | Blythe | 88/73 |
| 2,991,690 A | 7/1961 | Grey et al. | 88/16.6 |
| RE25,169 E | 5/1962 | Glenn | |
| 3,256,465 A | 6/1966 | Weissenstern et al. | 317/101 |
| 3,388,301 A | 6/1968 | James | 317/234 |
| 3,443,871 A | 5/1969 | Chitayat | 356/106 |
| 3,553,364 A | 1/1971 | Lee | 178/7.3 |
| 3,576,394 A | 4/1971 | Lee | 178/7.3 |
| 3,600,798 A | 8/1971 | Lee | 29/592 |
| 3,656,837 A | 4/1972 | Sandbank | 350/161 |
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Ernstoff et al. | 178/5.4 BD |
| 3,783,184 A | 1/1974 | Ernstoff et al. | 178/5.4 BD |
| 3,792,916 A | 2/1974 | Sarna | 350/163 |
| 3,802,769 A | 4/1974 | Rotz et al. | 352/43 |
| 3,811,186 A | 5/1974 | Larnerd et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.5 D |
| 3,896,338 A | 7/1975 | Nathanson et al. | 315/373 |
| 3,915,548 A | 10/1975 | Opittek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,011,009 A | 3/1977 | Lama et al. | 350/162 R |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/68 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 128/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/356 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,487,677 A | 12/1984 | Murphy | 204/247 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,558,171 A | 12/1985 | Gantley et al. | 174/52 FP |
| 4,561,011 A | 12/1985 | Kohara et al. | |
| 4,561,044 A | 12/1985 | Ogura et al. | 362/84 |
| 4,566,935 A | 1/1986 | Hornbeck | 156/626 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |

| | | | | | |
|---|---|---|---|---|---|
| 4,641,193 A | 2/1987 | Glenn ........................ 358/233 | 4,952,925 A | 8/1990 | Haastert ..................... 340/784 |
| 4,645,881 A | 2/1987 | LeToumelin et al. ........ 379/252 | 4,954,789 A | 9/1990 | Sampsell ..................... 330/4.3 |
| 4,646,158 A | 2/1987 | Ohno et al. ................. 358/236 | 4,956,619 A | 9/1990 | Hornbeck ..................... 330/4.3 |
| 4,649,085 A | 3/1987 | Landram ..................... 428/620 | 4,961,633 A | 10/1990 | Ibrahim et al. ............. 350/392 |
| 4,649,432 A | 3/1987 | Watanabe ..................... 358/241 | 4,963,012 A | 10/1990 | Tracy et al. ................. 350/641 |
| 4,652,932 A | 3/1987 | Miyajima et al. ........... 358/236 | 4,970,575 A | 11/1990 | Soga et al. ..................... 357/72 |
| 4,655,539 A | 4/1987 | Caulfield et al. ............. 350/3.6 | 4,978,202 A | 12/1990 | Yang ........................ 350/331 R |
| 4,660,938 A | 4/1987 | Kazan ........................ 350/355 | 4,982,184 A | 1/1991 | Kirkwood ..................... 340/783 |
| 4,661,828 A | 4/1987 | Miller, Jr. et al. .......... 346/108 | 4,982,265 A | 1/1991 | Watanabe et al. ................. 357/75 |
| 4,662,746 A | 5/1987 | Hornbeck ..................... 350/269 | 4,984,824 A | 1/1991 | Antes et al. ..................... 283/91 |
| 4,663,670 A | 5/1987 | Ito et al. ..................... 385/245 | 4,999,308 A | 3/1991 | Nishiura et al. ................. 437/4 |
| 4,687,326 A | 8/1987 | Corby, Jr. ........................ 356/5 | 5,003,300 A | 3/1991 | Wells ........................ 340/705 |
| 4,698,602 A | 10/1987 | Armitage ..................... 332/7.51 | 5,009,473 A | 4/1991 | Hunter et al. ................. 350/6.6 |
| 4,700,276 A | 10/1987 | Freyman et al. ............. 361/403 | 5,013,141 A | 5/1991 | Sakata ........................ 350/348 |
| 4,707,064 A | 11/1987 | Dobrowolski et al. ... 350/96.19 | 5,018,256 A | 5/1991 | Hornbeck ..................... 29/25.01 |
| 4,709,995 A | 12/1987 | Kuribayashi et al. ....... 350/350 | 5,022,750 A | 6/1991 | Flasck ........................ 353/31 |
| 4,710,732 A | 12/1987 | Hornbeck ..................... 332/7.51 | 5,023,905 A | 6/1991 | Wells et al. ..................... 379/96 |
| 4,711,526 A | 12/1987 | Hennings et al. ........... 350/170 | 5,024,494 A | 6/1991 | Williams et al. ............. 350/3.6 |
| 4,714,326 A | 12/1987 | Usui et al. ..................... 350/485 | 5,028,939 A | 7/1991 | Hornbeck et al. ........... 346/160 |
| 4,717,066 A | 1/1988 | Goldenberg et al. ........ 228/179 | 5,031,144 A | 7/1991 | Persky ........................ 365/145 |
| 4,719,507 A | 1/1988 | Bos ........................ 358/92 | 5,035,473 A | 7/1991 | Kuwayama et al. ........... 350/3.7 |
| 4,721,629 A | 1/1988 | Sakai et al. ..................... 427/35 | 5,037,173 A | 8/1991 | Sampsell et al. ............. 385/17 |
| 4,722,593 A | 2/1988 | Shimazaki ..................... 350/336 | 5,039,628 A | 8/1991 | Carey ........................ 437/183 |
| 4,724,467 A | 2/1988 | Yip et al. ..................... 355/71 | 5,040,052 A | 8/1991 | McDavid ..................... 357/80 |
| 4,728,185 A | 3/1988 | Thomas ..................... 353/122 | 5,041,395 A | 8/1991 | Steffen ........................ 437/206 |
| 4,743,091 A | 5/1988 | Gelbart ..................... 350/252 | 5,041,851 A | 8/1991 | Nelson ........................ 346/160 |
| 4,744,633 A | 5/1988 | Sheiman ..................... 350/132 | 5,043,917 A | 8/1991 | Okamoto ..................... 364/518 |
| 4,747,671 A | 5/1988 | Takahashi et al. ........... 350/336 | 5,048,077 A | 9/1991 | Wells et al. ..................... 379/96 |
| 4,751,509 A | 6/1988 | Kubota et al. ............... 340/784 | 5,049,901 A | 9/1991 | Gelbart ........................ 346/108 |
| 4,761,253 A | 8/1988 | Antes ........................ 264/1.3 | 5,058,992 A | 10/1991 | Takahashi ..................... 359/567 |
| 4,763,975 A | 8/1988 | Scifres et al. ............. 350/96.15 | 5,060,058 A | 10/1991 | Goldenberg et al. ........... 358/60 |
| 4,765,865 A | 8/1988 | Gealer et al. ................. 156/647 | 5,061,049 A | 10/1991 | Hornbeck ..................... 359/224 |
| 4,772,094 A | 9/1988 | Sheiman ..................... 350/133 | 5,066,614 A | 11/1991 | Dunaway et al. ........... 437/209 |
| 4,797,694 A | 1/1989 | Agostinelli et al. ......... 346/160 | 5,068,205 A | 11/1991 | Baxter et al. ................. 437/205 |
| 4,797,918 A | 1/1989 | Lee et al. ..................... 380/20 | 5,072,239 A | 12/1991 | Mitcham et al. ............. 346/108 |
| 4,801,194 A | 1/1989 | Agostinelli et al. ......... 350/356 | 5,072,418 A | 12/1991 | Boutaud et al. ....... 364/715.06 |
| 4,803,560 A | 2/1989 | Matsunaga et al. ........... 359/236 | 5,074,947 A | 12/1991 | Estes et al. ............... 156/307.3 |
| 4,804,641 A | 2/1989 | Arlt et al. ..................... 437/227 | 5,075,940 A | 12/1991 | Kuriyama et al. ........... 29/25.03 |
| 4,807,021 A | 2/1989 | Okumura ..................... 357/75 | 5,079,544 A | 1/1992 | DeMond et al. ............. 340/701 |
| 4,807,965 A | 2/1989 | Garakani ..................... 350/131 | 5,081,617 A | 1/1992 | Gelbart ........................ 369/112 |
| 4,809,078 A | 2/1989 | Yabe et al. ................. 358/236 | 5,083,857 A | 1/1992 | Hornbeck ..................... 359/291 |
| 4,811,082 A | 3/1989 | Jacobs et al. ..................... 357/80 | 5,085,497 A | 2/1992 | Um et al. ..................... 359/848 |
| 4,811,210 A | 3/1989 | McAulay ..................... 364/200 | 5,089,903 A | 2/1992 | Kuwayama et al. ........... 359/15 |
| 4,814,759 A | 3/1989 | Gombrich et al. ........... 340/771 | 5,093,281 A | 3/1992 | Eshima ........................ 437/217 |
| 4,817,850 A | 4/1989 | Wiener-Avnear et al. ... 228/119 | 5,096,279 A | 3/1992 | Hornbeck et al. ........... 359/230 |
| 4,824,200 A | 4/1989 | Isono et al. ............... 350/96.16 | 5,099,353 A | 3/1992 | Hornbeck ..................... 359/291 |
| 4,827,391 A | 5/1989 | Sills ........................ 363/41 | 5,101,184 A | 3/1992 | Antes ........................ 235/454 |
| 4,829,365 A | 5/1989 | Eichenlaub ..................... 358/3 | 5,101,236 A | 3/1992 | Nelson et al. ............. 355/229 |
| 4,836,649 A | 6/1989 | Ledebuhr et al. ........ 350/331 R | 5,103,334 A | 4/1992 | Swanberg ..................... 359/197 |
| 4,856,863 A | 8/1989 | Sampsell et al. ........ 350/96.16 | 5,105,207 A | 4/1992 | Nelson ........................ 346/160 |
| 4,856,869 A | 8/1989 | Sakata et al. ........... 350/162.18 | 5,105,299 A | 4/1992 | Anderson et al. ........... 359/223 |
| 4,859,012 A | 8/1989 | Cohn ........................ 350/96.24 | 5,105,369 A | 4/1992 | Nelson ........................ 364/525 |
| 4,859,060 A | 8/1989 | Katagiri et al. ............. 356/352 | 5,107,372 A | 4/1992 | Gelbart et al. ............. 359/824 |
| 4,866,488 A | 9/1989 | Frensley ........................ 357/4 | 5,112,436 A | 5/1992 | Bol ........................ 156/643 |
| 4,882,683 A | 11/1989 | Rupp et al. ................. 364/521 | 5,113,272 A | 5/1992 | Reamey ........................ 359/53 |
| 4,893,509 A | 1/1990 | MacIver et al. ........ 73/517 AV | 5,113,285 A | 5/1992 | Franklin et al. ............. 359/465 |
| 4,896,325 A | 1/1990 | Coldren ........................ 372/20 | 5,115,344 A | 5/1992 | Jaskie ........................ 359/573 |
| 4,896,948 A | 1/1990 | Dono et al. ................. 350/355 | 5,119,204 A | 6/1992 | Hashimoto et al. ........... 358/254 |
| 4,897,708 A | 1/1990 | Clements ..................... 357/65 | 5,121,343 A | 6/1992 | Faris ........................ 395/111 |
| 4,902,083 A | 2/1990 | Wells ........................ 350/6.6 | 5,126,812 A | 6/1992 | Greiff ........................ 357/25 |
| 4,915,463 A | 4/1990 | Barbee, Jr. ..................... 350/1.1 | 5,126,826 A | 6/1992 | Kauchi et al. ................. 357/72 |
| 4,915,479 A | 4/1990 | Clarke ........................ 350/345 | 5,126,836 A | 6/1992 | Um ........................ 358/60 |
| 4,924,413 A | 5/1990 | Suwannukul ............... 364/521 | 5,128,660 A | 7/1992 | DeMond et al. ............. 340/707 |
| 4,926,241 A | 5/1990 | Carey ........................ 357/75 | 5,129,716 A | 7/1992 | Holakovszky et al. ........ 351/50 |
| 4,930,043 A | 5/1990 | Wiegand ..................... 361/283 | 5,132,723 A | 7/1992 | Gelbart ........................ 355/40 |
| 4,934,773 A | 6/1990 | Becker ........................ 350/6.6 | 5,132,812 A | 7/1992 | Takahashi et al. ............. 359/9 |
| 4,940,309 A | 7/1990 | Baum ........................ 350/171 | 5,136,695 A | 8/1992 | Goldshlag et al. ............. 395/275 |
| 4,943,815 A | 7/1990 | Aldrich et al. ............. 346/108 | 5,137,836 A | 8/1992 | Lam ........................ 437/8 |
| 4,945,773 A | 8/1990 | Sickafus ..................... 73/862.59 | 5,142,303 A | 8/1992 | Nelson ........................ 346/108 |
| 4,949,148 A | 8/1990 | Bartelink ..................... 357/74 | 5,142,405 A | 8/1992 | Hornbeck ..................... 359/226 |
| 4,950,890 A | 8/1990 | Gelbart ..................... 250/237 G | 5,142,677 A | 8/1992 | Ehlig et al. ................. 395/650 |

| Patent No. | Date | Inventor | Class |
|---|---|---|---|
| 5,144,472 A | 9/1992 | Sang, Jr. et al. | 359/254 |
| 5,147,815 A | 9/1992 | Casto | 437/51 |
| 5,148,157 A | 9/1992 | Florence | 340/783 |
| 5,148,506 A | 9/1992 | McDonald | 385/16 |
| 5,149,405 A | 9/1992 | Bruns et al. | 204/129.1 |
| 5,150,205 A | 9/1992 | Um et al. | 358/60 |
| 5,151,718 A | 9/1992 | Nelson | 346/160 |
| 5,151,724 A | 9/1992 | Kikinis | 357/17 |
| 5,151,763 A | 9/1992 | Marek et al. | 357/26 |
| 5,153,770 A | 10/1992 | Harris | 359/245 |
| 5,155,604 A | 10/1992 | Miekka et al. | 359/2 |
| 5,155,615 A | 10/1992 | Tagawa | 359/213 |
| 5,155,778 A | 10/1992 | Magel et al. | 385/18 |
| 5,155,812 A | 10/1992 | Ehlig et al. | 395/275 |
| 5,157,304 A | 10/1992 | Kane et al. | 313/495 |
| 5,159,485 A | 10/1992 | Nelson | 359/291 |
| 5,161,042 A | 11/1992 | Hamada | 359/41 |
| 5,162,787 A | 11/1992 | Thompson et al. | 340/794 |
| 5,164,019 A | 11/1992 | Sinton | 136/249 |
| 5,165,013 A | 11/1992 | Faris | 395/104 |
| 5,168,401 A | 12/1992 | Endriz | 359/625 |
| 5,168,406 A | 12/1992 | Nelson | 359/855 |
| 5,170,156 A | 12/1992 | DeMond et al. | 340/794 |
| 5,170,269 A | 12/1992 | Lin et al. | 359/9 |
| 5,170,283 A | 12/1992 | O'Brien et al. | 359/291 |
| 5,172,161 A | 12/1992 | Nelson | 355/200 |
| 5,172,262 A | 12/1992 | Hornbeck | 359/223 |
| 5,177,724 A | 1/1993 | Gelbart | 369/44.16 |
| 5,178,728 A | 1/1993 | Boysel et al. | 156/656 |
| 5,179,274 A | 1/1993 | Sampsell | 250/208.2 |
| 5,179,367 A | 1/1993 | Shimizu | 340/700 |
| 5,181,231 A | 1/1993 | Parikh et al. | 377/26 |
| 5,182,665 A | 1/1993 | O'Callaghan et al. | 359/95 |
| 5,185,660 A | 2/1993 | Um | 358/60 |
| 5,185,823 A | 2/1993 | Kaku et al. | 385/2 |
| 5,188,280 A | 2/1993 | Nakao et al. | 228/123 |
| 5,189,404 A | 2/1993 | Masimo et al. | 340/720 |
| 5,189,505 A | 2/1993 | Bartelink | 257/419 |
| 5,191,405 A | 3/1993 | Tomita et al. | 257/777 |
| 5,192,864 A | 3/1993 | McEwen et al. | 250/234 |
| 5,192,946 A | 3/1993 | Thompson et al. | 340/794 |
| 5,198,895 A | 3/1993 | Vick | 358/103 |
| D334,557 S | 4/1993 | Hunter et al. | D14/114 |
| D334,742 S | 4/1993 | Hunter et al. | D14/113 |
| 5,202,785 A | 4/1993 | Nelson | 359/214 |
| 5,206,629 A | 4/1993 | DeMond et al. | 340/719 |
| 5,206,829 A | 4/1993 | Thakoor et al. | 365/117 |
| 5,208,818 A | 5/1993 | Gelbart et al. | 372/30 |
| 5,208,891 A | 5/1993 | Prysner | 385/116 |
| 5,210,637 A | 5/1993 | Puzey | 359/263 |
| 5,212,115 A | 5/1993 | Cho et al. | 437/208 |
| 5,212,555 A | 5/1993 | Stoltz | 358/206 |
| 5,212,582 A | 5/1993 | Nelson | 359/224 |
| 5,214,308 A | 5/1993 | Nishiouchi et al. | 257/692 |
| 5,214,419 A | 5/1993 | DeMond et al. | 340/794 |
| 5,214,420 A | 5/1993 | Thompson et al. | 340/795 |
| 5,216,278 A | 6/1993 | Lin et al. | |
| 5,216,537 A | 6/1993 | Hornbeck | 359/291 |
| 5,216,544 A | 6/1993 | Horikawa et al. | 359/622 |
| 5,219,794 A | 6/1993 | Satoh et al. | 437/209 |
| 5,220,200 A | 6/1993 | Blanton | 257/778 |
| 5,221,400 A | 6/1993 | Staller et al. | 156/292 |
| 5,221,982 A | 6/1993 | Faris | 359/93 |
| 5,224,088 A | 6/1993 | Atiya | 369/97 |
| D337,320 S | 7/1993 | Hunter et al. | D14/113 |
| 5,226,099 A | 7/1993 | Mignardi et al. | 385/19 |
| 5,229,597 A | 7/1993 | Fukatsu | 250/208.2 |
| 5,230,005 A | 7/1993 | Rubino et al. | 372/20 |
| 5,231,363 A | 7/1993 | Sano et al. | 332/109 |
| 5,231,388 A | 7/1993 | Stoltz | 340/783 |
| 5,231,432 A | 7/1993 | Glenn | 353/31 |
| 5,233,456 A | 8/1993 | Nelson | 359/214 |
| 5,233,460 A | 8/1993 | Partlo et al. | 359/247 |
| 5,233,874 A | 8/1993 | Putty et al. | 73/517 AV |
| 5,237,340 A | 8/1993 | Nelson | 346/108 |
| 5,237,435 A | 8/1993 | Kurematsu et al. | 359/41 |
| 5,239,448 A | 8/1993 | Perkins et al. | 361/764 |
| 5,239,806 A | 8/1993 | Maslakow | 53/432 |
| 5,240,818 A | 8/1993 | Mignardi et al. | 430/321 |
| 5,245,686 A | 9/1993 | Faris et al. | 385/120 |
| 5,247,180 A | 9/1993 | Mitcham et al. | 250/492.1 |
| 5,247,593 A | 9/1993 | Lin et al. | 385/17 |
| 5,249,245 A | 9/1993 | Lebby et al. | 385/89 |
| 5,251,057 A | 10/1993 | Guerin et al. | 359/249 |
| 5,251,058 A | 10/1993 | MacArthur | 359/249 |
| 5,254,980 A | 10/1993 | Hendrix et al. | 345/84 |
| 5,255,100 A | 10/1993 | Urbanus | 358/231 |
| 5,256,869 A | 10/1993 | Lin et al. | 250/201.9 |
| 5,258,325 A | 11/1993 | Spitzer et al. | 437/86 |
| 5,260,718 A | 11/1993 | Rommelmann et al. | 346/107 R |
| 5,260,798 A | 11/1993 | Um et al. | 358/233 |
| 5,262,000 A | 11/1993 | Welbourn et al. | 156/643 |
| 5,272,473 A | 12/1993 | Thompson et al. | 345/7 |
| 5,278,652 A | 1/1994 | Urbanus et al. | 358/160 |
| 5,278,925 A | 1/1994 | Boysel et al. | 385/14 |
| 5,280,277 A | 1/1994 | Hornbeck | 345/108 |
| 5,281,887 A | 1/1994 | Engle | 310/335 |
| 5,281,957 A | 1/1994 | Schoolman | 345/8 |
| 5,285,105 A | 2/1994 | Cain | 257/672 |
| 5,285,196 A | 2/1994 | Gale, Jr. | 345/108 |
| 5,285,407 A | 2/1994 | Gale et al. | 365/189.11 |
| 5,287,096 A | 2/1994 | Thompson et al. | 345/147 |
| 5,287,215 A | 2/1994 | Warde et al. | 359/293 |
| 5,289,172 A | 2/1994 | Gale, Jr. et al. | 345/108 |
| 5,291,317 A | 3/1994 | Newswanger | 359/15 |
| 5,291,473 A | 3/1994 | Pauli | 369/112 |
| 5,293,511 A | 3/1994 | Poradish et al. | 257/434 |
| 5,296,408 A | 3/1994 | Wilbarg et al. | 437/203 |
| 5,296,891 A | 3/1994 | Vogt et al. | 355/67 |
| 5,296,950 A | 3/1994 | Lin et al. | 359/9 |
| 5,298,460 A | 3/1994 | Nishiguchi et al. | 437/183 |
| 5,299,037 A | 3/1994 | Sakata | 359/41 |
| 5,299,289 A | 3/1994 | Omae et al. | 359/95 |
| 5,300,813 A | 4/1994 | Joshi et al. | 257/752 |
| 5,301,062 A | 4/1994 | Takahashi et al. | 359/567 |
| 5,303,043 A | 4/1994 | Glenn | 348/40 |
| 5,303,055 A | 4/1994 | Hendrix et al. | 348/761 |
| 5,307,056 A | 4/1994 | Urbanus | 340/189 |
| 5,307,185 A | 4/1994 | Jones et al. | 359/41 |
| 5,310,624 A | 5/1994 | Ehrlich | 430/322 |
| 5,311,349 A | 5/1994 | Anderson et al. | 359/223 |
| 5,311,360 A * | 5/1994 | Bloom et al. | 359/572 |
| 5,312,513 A | 5/1994 | Florence et al. | 156/643 |
| 5,313,479 A | 5/1994 | Florence | 372/26 |
| 5,313,648 A | 5/1994 | Ehlig et al. | 395/800 |
| 5,313,835 A | 5/1994 | Dunn | 73/505 |
| 5,315,418 A | 5/1994 | Sprague et al. | 359/41 |
| 5,315,423 A | 5/1994 | Hong | 359/124 |
| 5,315,429 A | 5/1994 | Abramov | 359/224 |
| 5,319,214 A | 6/1994 | Gregory et al. | 250/504 R |
| 5,319,668 A | 6/1994 | Luecke | 372/107 |
| 5,319,789 A | 6/1994 | Ehlig et al. | 395/800 |
| 5,319,792 A | 6/1994 | Ehlig et al. | 395/800 |
| 5,320,709 A | 6/1994 | Bowden et al. | |
| 5,321,416 A | 6/1994 | Bassett et al. | 345/8 |
| 5,323,002 A | 6/1994 | Sampsell et al. | 250/252.1 |
| 5,323,051 A | 6/1994 | Adams et al. | 257/417 |
| 5,325,116 A | 6/1994 | Sampsell | 346/108 |
| 5,327,286 A | 7/1994 | Sampsell et al. | 359/561 |
| 5,329,289 A | 7/1994 | Sakamoto et al. | 345/126 |
| 5,330,301 A | 7/1994 | Brancher | 414/417 |
| 5,330,878 A | 7/1994 | Nelson | 430/311 |

| Patent No. | Date | Inventor | Class |
|---|---|---|---|
| 5,331,454 A | 7/1994 | Hornbeck | 359/224 |
| 5,334,991 A | 8/1994 | Wells et al. | 345/8 |
| 5,339,116 A | 8/1994 | Urbanus et al. | 348/716 |
| 5,339,177 A | 8/1994 | Jenkins et al. | 359/35 |
| 5,340,772 A | 8/1994 | Rosotker | 437/226 |
| 5,345,521 A | 9/1994 | McDonald et al. | 385/19 |
| 5,347,321 A | 9/1994 | Gove | 348/663 |
| 5,347,378 A | 9/1994 | Handschy et al. | 359/53 |
| 5,347,433 A | 9/1994 | Sedlmayr | 362/32 |
| 5,348,619 A | 9/1994 | Bohannon et al. | 156/664 |
| 5,349,687 A | 9/1994 | Ehlig et al. | 395/800 |
| 5,351,052 A | 9/1994 | D'Hont et al. | 342/42 |
| 5,352,926 A | 10/1994 | Andrews | 257/717 |
| 5,354,416 A | 10/1994 | Okudaira | 156/643 |
| 5,357,369 A | 10/1994 | Pilling et al. | 359/462 |
| 5,357,803 A | 10/1994 | Lane | 73/517 B |
| 5,359,349 A | 10/1994 | Jambor et al. | 345/168 |
| 5,359,451 A | 10/1994 | Gelbart et al. | 359/285 |
| 5,361,131 A | 11/1994 | Tekemori et al. | 356/355 |
| 5,363,220 A | 11/1994 | Kuwayama et al. | 359/3 |
| 5,365,283 A | 11/1994 | Doherty et al. | 348/743 |
| 5,367,585 A | 11/1994 | Ghezzo et al. | 385/23 |
| 5,370,742 A | 12/1994 | Mitchell et al. | 134/10 |
| 5,371,543 A | 12/1994 | Anderson | 348/270 |
| 5,371,618 A | 12/1994 | Tai et al. | 359/53 |
| 5,377,705 A | 1/1995 | Smith, Jr. et al. | 134/95.3 |
| 5,382,961 A | 1/1995 | Gale, Jr. | 345/108 |
| 5,387,924 A | 2/1995 | Gale, Jr. et al. | 345/108 |
| 5,389,182 A | 2/1995 | Mignardi | 156/344 |
| 5,391,881 A | 2/1995 | Jeuch et al. | 250/370.09 |
| 5,392,140 A | 2/1995 | Ezra et al. | 359/41 |
| 5,392,151 A | 2/1995 | Nelson | 359/223 |
| 5,394,303 A | 2/1995 | Yamaji | 361/749 |
| 5,398,071 A | 3/1995 | Gove et al. | 348/558 |
| 5,399,898 A | 3/1995 | Rostoker | 257/499 |
| 5,404,365 A | 4/1995 | Hiiro | 372/27 |
| 5,404,485 A | 4/1995 | Ban | 395/425 |
| 5,408,123 A | 4/1995 | Murai | 257/531 |
| 5,410,315 A | 4/1995 | Huber | 342/42 |
| 5,411,769 A | 5/1995 | Hornbeck | 427/534 |
| 5,412,186 A | 5/1995 | Gale | 219/679 |
| 5,412,501 A | 5/1995 | Fisli | 359/286 |
| 5,418,584 A | 5/1995 | Larson | 353/122 |
| 5,420,655 A | 5/1995 | Shimizu | 353/33 |
| 5,420,722 A | 5/1995 | Bielak | 359/708 |
| 5,426,072 A | 6/1995 | Finnila | 437/208 |
| 5,427,975 A | 6/1995 | Sparks et al. | 437/79 |
| 5,430,524 A | 7/1995 | Nelson | 355/200 |
| 5,435,876 A | 7/1995 | Alfaro et al. | 156/247 |
| 5,438,477 A | 8/1995 | Pasch | 361/689 |
| 5,439,731 A | 8/1995 | Li et al. | 428/209 |
| 5,442,411 A | 8/1995 | Urbanus et al. | 348/771 |
| 5,442,414 A | 8/1995 | Janssen et al. | 353/98 |
| 5,444,566 A | 8/1995 | Gale et al. | 359/291 |
| 5,445,559 A | 8/1995 | Gale et al. | 451/388 |
| 5,446,479 A | 8/1995 | Thompson et al. | 345/139 |
| 5,447,600 A | 9/1995 | Webb | 216/2 |
| 5,448,314 A | 9/1995 | Heimbuch et al. | 348/743 |
| 5,448,546 A | 9/1995 | Pauli | 369/112 |
| 5,450,088 A | 9/1995 | Meier et al. | 342/51 |
| 5,450,219 A | 9/1995 | Gold et al. | 359/40 |
| 5,451,103 A | 9/1995 | Hatanaka et al. | 353/31 |
| 5,452,024 A | 9/1995 | Sampsell | 348/755 |
| 5,452,138 A | 9/1995 | Mignardi et al. | 359/855 |
| 5,453,747 A | 9/1995 | D'Hont et al. | 342/42 |
| 5,453,778 A | 9/1995 | Venkateswar et al. | 347/239 |
| 5,453,803 A | 9/1995 | Shapiro et al. | 353/119 |
| 5,454,160 A | 10/1995 | Nickel | 29/840 |
| 5,454,906 A | 10/1995 | Baker et al. | 216/66 |
| 5,455,445 A | 10/1995 | Kurtz et al. | 257/419 |
| 5,455,455 A | 10/1995 | Badehi | 257/690 |
| 5,455,602 A | 10/1995 | Tew | 347/239 |
| 5,457,493 A | 10/1995 | Leddy et al. | 348/164 |
| 5,457,566 A | 10/1995 | Sampsell et al. | 359/292 |
| 5,457,567 A | 10/1995 | Shinohara | 359/305 |
| 5,458,716 A | 10/1995 | Alfaro et al. | 156/245 |
| 5,459,492 A | 10/1995 | Venkateswar | 347/253 |
| 5,459,528 A | 10/1995 | Pettitt | 348/568 |
| 5,459,592 A | 10/1995 | Shibatani et al. | 359/40 |
| 5,459,610 A * | 10/1995 | Bloom et al. | 359/572 |
| 5,461,197 A | 10/1995 | Hiruta et al. | 174/52.4 |
| 5,461,410 A | 10/1995 | Venkateswar et al. | 347/240 |
| 5,461,411 A | 10/1995 | Florence et al. | 347/240 |
| 5,461,547 A | 10/1995 | Ciupke et al. | 362/31 |
| 5,463,347 A | 10/1995 | Jones et al. | 330/253 |
| 5,463,497 A | 10/1995 | Muraki et al. | 359/618 |
| 5,465,175 A | 11/1995 | Woodgate et al. | 359/463 |
| 5,467,106 A | 11/1995 | Salomon | 345/87 |
| 5,467,138 A | 11/1995 | Gove | 348/452 |
| 5,467,146 A | 11/1995 | Huang et al. | 348/743 |
| 5,469,302 A | 11/1995 | Lim | 359/846 |
| 5,471,341 A | 11/1995 | Warde et al. | 359/293 |
| 5,473,512 A | 12/1995 | Degani et al. | 361/760 |
| 5,475,236 A | 12/1995 | Yoshizaki | 257/48 |
| 5,480,839 A | 1/1996 | Ezawa et al. | 437/209 |
| 5,481,118 A | 1/1996 | Tew | 250/551 |
| 5,481,133 A | 1/1996 | Hsu | 257/621 |
| 5,482,564 A | 1/1996 | Douglas et al. | 134/18 |
| 5,482,818 A | 1/1996 | Nelson | 430/394 |
| 5,483,307 A | 1/1996 | Anderson | 353/98 |
| 5,485,172 A | 1/1996 | Sawachika et al. | 345/8 |
| 5,485,304 A | 1/1996 | Kaeriyama | 359/291 |
| 5,485,354 A | 1/1996 | Ciupke et al. | 362/31 |
| 5,486,698 A | 1/1996 | Hanson et al. | 250/332 |
| 5,486,946 A | 1/1996 | Jachimowicz et al. | 359/263 |
| 5,488,431 A | 1/1996 | Gove et al. | 348/716 |
| 5,489,952 A | 2/1996 | Gove et al. | 348/771 |
| 5,490,009 A | 2/1996 | Venkateswar et al. | 359/291 |
| 5,491,510 A | 2/1996 | Gove | 348/77 |
| 5,491,612 A | 2/1996 | Nicewarner, Jr. | 361/760 |
| 5,491,715 A | 2/1996 | Flaxl | 375/344 |
| 5,493,177 A | 2/1996 | Muller et al. | 313/578 |
| 5,493,439 A | 2/1996 | Engle | 359/292 |
| 5,497,172 A | 3/1996 | Doherty et al. | 345/85 |
| 5,497,197 A | 3/1996 | Gove et al. | 348/388 |
| 5,497,262 A | 3/1996 | Kaeriyama | 359/223 |
| 5,499,060 A | 3/1996 | Gove et al. | 348/651 |
| 5,499,062 A | 3/1996 | Urbanus | 348/771 |
| 5,500,761 A | 3/1996 | Goossen et al. | 359/290 |
| 5,502,481 A | 3/1996 | Dentinger et al. | 348/51 |
| 5,504,504 A | 4/1996 | Markandey et al. | 345/214 |
| 5,504,514 A | 4/1996 | Nelson | 347/130 |
| 5,504,575 A | 4/1996 | Stafford | 356/330 |
| 5,504,614 A | 4/1996 | Webb et al. | 359/223 |
| 5,506,171 A | 4/1996 | Leonard et al. | 437/187 |
| 5,506,597 A | 4/1996 | Thompson et al. | 345/85 |
| 5,506,720 A | 4/1996 | Yoon | 359/224 |
| 5,508,558 A | 4/1996 | Robinette, Jr. et al. | 257/700 |
| 5,508,561 A | 4/1996 | Tago et al. | 257/737 |
| 5,508,565 A | 4/1996 | Hatakeyama et al. | 257/777 |
| 5,508,750 A | 4/1996 | Hewlett et al. | 348/558 |
| 5,508,840 A | 4/1996 | Vogel et al. | 359/291 |
| 5,508,841 A | 4/1996 | Lin et al. | 359/318 |
| 5,510,758 A | 4/1996 | Fujita et al. | 333/247 |
| 5,510,824 A | 4/1996 | Nelson | 347/239 |
| 5,512,374 A | 4/1996 | Wallace et al. | 428/422 |
| 5,512,748 A | 4/1996 | Hanson | 250/332 |
| 5,515,076 A | 5/1996 | Thompson et al. | 345/139 |
| 5,516,125 A | 5/1996 | McKenna | 279/3 |
| 5,517,340 A | 5/1996 | Doany et al. | 359/41 |
| 5,517,347 A | 5/1996 | Sampsell | 359/224 |
| 5,517,357 A | 5/1996 | Shibayama | 359/547 |

| | | | |
|---|---|---|---|
| 5,517,359 A | 5/1996 | Gelbart ................. 359/623 |
| 5,519,251 A | 5/1996 | Sato et al. ............ 257/666 |
| 5,519,450 A | 5/1996 | Urbanus et al. ....... 348/600 |
| 5,521,748 A | 5/1996 | Sarraf ................... 359/321 |
| 5,523,619 A | 6/1996 | McAllister et al. ..... 257/686 |
| 5,523,628 A | 6/1996 | Williams et al. ....... 257/777 |
| 5,523,803 A | 6/1996 | Urbanus et al. ....... 348/771 |
| 5,523,878 A | 6/1996 | Wallace et al. ........ 359/290 |
| 5,523,881 A | 6/1996 | Florence et al. ....... 359/561 |
| 5,523,920 A | 6/1996 | Machuga et al. ...... 361/767 |
| 5,524,155 A | 6/1996 | Weaver ................. 385/24 |
| 5,526,834 A | 6/1996 | Mielnik et al. ......... 134/105 |
| 5,534,107 A | 7/1996 | Gray et al. ........... 156/643.1 |
| 5,534,883 A | 7/1996 | Koh ...................... 345/3 |
| 5,539,422 A | 7/1996 | Heacock et al. ........ 345/8 |
| 5,544,306 A | 8/1996 | Deering et al. ........ 395/164 |
| 5,552,635 A | 9/1996 | Kim et al. |
| 5,554,304 A | 9/1996 | Suzuki ................. 216/2 |
| 5,576,878 A | 11/1996 | Henck ................... 359/224 |
| 5,602,671 A | 2/1997 | Hornbeck ............. 359/224 |
| 5,606,181 A | 2/1997 | Sakuma et al. ........ 257/88 |
| 5,606,447 A | 2/1997 | Asada et al. .......... 359/199 |
| 5,610,438 A | 3/1997 | Wallace et al. ........ 257/682 |
| 5,623,361 A | 4/1997 | Engle .................... 359/291 |
| 5,629,566 A | 5/1997 | Doi et al. .............. 257/789 |
| 5,629,801 A | 5/1997 | Staker et al. ........... 359/572 |
| 5,640,216 A | 6/1997 | Hasegawa et al. ..... 349/58 |
| 5,658,698 A | 8/1997 | Yagi et al. ............. 430/11 |
| 5,661,592 A | 8/1997 | Bornstein et al. ....... 359/291 |
| 5,661,593 A | 8/1997 | Engle .................... 359/292 |
| 5,663,817 A | 9/1997 | Frapin et al. .......... 349/5 |
| 5,668,611 A | 9/1997 | Ernstoff et al. ........ 348/771 |
| 5,673,139 A | 9/1997 | Johnson ................ 359/291 |
| 5,677,783 A * | 10/1997 | Bloom et al. .......... 359/224 |
| 5,689,361 A | 11/1997 | Damen et al. ......... 359/284 |
| 5,691,836 A | 11/1997 | Clark ................... 359/247 |
| 5,694,740 A | 12/1997 | Martin et al. .......... 53/431 |
| 5,696,560 A | 12/1997 | Songer .................. 348/436 |
| 5,699,740 A | 12/1997 | Gelbart ................. 101/477 |
| 5,704,700 A | 1/1998 | Kappel et al. ......... 353/31 |
| 5,707,160 A | 1/1998 | Bowen .................. 400/472 |
| 5,712,649 A | 1/1998 | Tosaki .................. 345/8 |
| 5,713,652 A | 2/1998 | Zavracky et al. ....... 353/122 |
| 5,726,480 A | 3/1998 | Pister ..................... 257/415 |
| 5,731,802 A | 3/1998 | Aras et al. ............. 345/148 |
| 5,734,224 A | 3/1998 | Tagawa et al. ......... 313/493 |
| 5,742,373 A | 4/1998 | Alvelda ................. 349/204 |
| 5,744,752 A | 4/1998 | McHerron et al. ...... 174/52.4 |
| 5,745,271 A | 4/1998 | Ford et al. ............. 359/130 |
| 5,757,354 A | 5/1998 | Kawamura ............ 345/126 |
| 5,757,536 A | 5/1998 | Ricco et al. ........... 359/224 |
| 5,764,280 A | 6/1998 | Bloom et al. .......... 348/53 |
| 5,768,009 A | 6/1998 | Little .................... 359/293 |
| 5,773,473 A | 6/1998 | Green et al. ........... 438/26 |
| 5,793,519 A | 8/1998 | Furlani et al. .......... 359/291 |
| 5,798,743 A | 8/1998 | Bloom ................... 345/90 |
| 5,798,805 A | 8/1998 | Ooi et al. .............. 349/10 |
| 5,801,074 A | 9/1998 | Kim et al. ............. 438/125 |
| 5,802,222 A | 9/1998 | Rasch et al. ........... 385/1 |
| 5,808,323 A | 9/1998 | Spaeth et al. .......... 257/88 |
| 5,808,797 A | 9/1998 | Bloom et al. .......... 359/572 |
| 5,815,126 A | 9/1998 | Fan et al. .............. 345/8 |
| 5,825,443 A | 10/1998 | Kawasaki et al. ...... 349/95 |
| 5,832,148 A | 11/1998 | Yariv |
| 5,835,255 A | 11/1998 | Miles ..................... 359/291 |
| 5,835,256 A | 11/1998 | Huibers .................. 359/291 |
| 5,837,562 A | 11/1998 | Cho ...................... 438/51 |
| 5,841,579 A | 11/1998 | Bloom et al. .......... 359/572 |
| 5,841,929 A | 11/1998 | Komatsu et al. |
| 5,844,711 A | 12/1998 | Long, Jr. ............... 359/291 |
| 5,847,859 A | 12/1998 | Murata ................. 359/201 |
| 5,862,164 A | 1/1999 | Hill ....................... 372/27 |
| 5,868,854 A | 2/1999 | Kojima et al. ......... 134/1.3 |
| 5,886,675 A | 3/1999 | Aye et al. .............. 345/7 |
| 5,892,505 A | 4/1999 | Tropper ................. 345/208 |
| 5,895,233 A | 4/1999 | Higashi et al. ......... 438/107 |
| 5,898,515 A | 4/1999 | Furlani et al. .......... 359/290 |
| 5,903,243 A | 5/1999 | Jones ..................... 345/7 |
| 5,903,395 A | 5/1999 | Rallison et al. ........ 359/630 |
| 5,904,737 A | 5/1999 | Preston et al. ......... 8/158 |
| 5,910,856 A | 6/1999 | Ghosh et al. .......... 359/291 |
| 5,912,094 A | 6/1999 | Aksyuk et al. ........ 430/5 |
| 5,912,608 A | 6/1999 | Asada .................... 335/222 |
| 5,914,801 A | 6/1999 | Dhuler et al. .......... 359/230 |
| 5,915,168 A | 6/1999 | Salatino et al. ........ 438/110 |
| 5,919,548 A | 7/1999 | Barron et al. .......... 428/138 |
| 5,920,411 A | 7/1999 | Duck et al. ............ 359/127 |
| 5,920,418 A | 7/1999 | Shiono et al. .......... 359/246 |
| 5,923,475 A | 7/1999 | Kurtz et al. ............ 359/619 |
| 5,926,309 A | 7/1999 | Little .................... 359/293 |
| 5,926,318 A | 7/1999 | Hebert .................. 359/618 |
| 5,942,791 A | 8/1999 | Shorrocks et al. ...... 257/522 |
| 5,949,390 A | 9/1999 | Nomura et al. ........ 345/32 |
| 5,949,570 A | 9/1999 | Shiono et al. .......... 359/291 |
| 5,953,161 A | 9/1999 | Troxell et al. ......... 359/618 |
| 5,955,771 A | 9/1999 | Kurtz et al. ............ 257/419 |
| 5,963,788 A | 10/1999 | Barron et al. .......... 438/48 |
| 5,978,127 A | 11/1999 | Berg ..................... 359/279 |
| 5,982,553 A | 11/1999 | Bloom et al. .......... 359/627 |
| 5,986,634 A | 11/1999 | Alioshin et al. ........ 345/126 |
| 5,986,796 A | 11/1999 | Miles .................... 359/260 |
| 5,995,303 A | 11/1999 | Honguh et al. ........ 359/708 |
| 5,999,319 A | 12/1999 | Castracane ............ 359/573 |
| 6,004,912 A | 12/1999 | Gudeman ............. 508/577 |
| 6,012,336 A | 1/2000 | Eaton et al. |
| 6,016,222 A | 1/2000 | Setani et al. ........... 359/571 |
| 6,025,859 A | 2/2000 | Ide et al. ............... 347/135 |
| 6,038,057 A | 3/2000 | Brazas, Jr. et al. ...... 359/291 |
| 6,040,748 A | 3/2000 | Gueissaz ................ 335/78 |
| 6,046,840 A | 4/2000 | Huibers .................. 359/291 |
| 6,055,090 A | 4/2000 | Miles .................... 359/291 |
| 6,057,520 A | 5/2000 | Goodwin-Johansson .... 200/181 |
| 6,061,166 A | 5/2000 | Furlani et al. .......... 359/254 |
| 6,061,489 A | 5/2000 | Ezra ..................... 385/115 |
| 6,062,461 A | 5/2000 | Sparks et al. .......... 228/123.1 |
| 6,064,404 A | 5/2000 | Aras et al. ............. 345/507 |
| 6,069,392 A | 5/2000 | Tai et al. ............... 257/419 |
| 6,071,652 A | 6/2000 | Feldman et al. ........ 430/5 |
| 6,075,632 A | 6/2000 | Braun ................... 359/124 |
| 6,084,626 A | 7/2000 | Ramanujan et al. ..... 347/239 |
| 6,088,102 A | 7/2000 | Manhart ............... 356/354 |
| 6,090,717 A | 7/2000 | Powell et al. .......... 438/710 |
| 6,091,521 A | 7/2000 | Popovich ............... 359/15 |
| 6,096,576 A | 8/2000 | Corbin et al. .......... 438/108 |
| 6,096,656 A | 8/2000 | Matzke et al. |
| 6,097,352 A | 8/2000 | Zavracky et al. ....... 345/7 |
| 6,101,036 A | 8/2000 | Bloom ................... 359/567 |
| 6,115,168 A | 9/2000 | Zhao et al. ............ 359/247 |
| 6,122,299 A | 9/2000 | DeMars et al. ........ 372/20 |
| 6,123,985 A | 9/2000 | Robinson et al. ....... 427/162 |
| 6,124,145 A | 9/2000 | Stemme et al. ........ 438/26 |
| 6,130,770 A | 10/2000 | Bloom ................... 359/224 |
| 6,144,481 A | 11/2000 | Kowarz et al. ......... 359/291 |
| 6,147,789 A | 11/2000 | Gelbart ................. 359/231 |
| 6,154,259 A | 11/2000 | Hargis et al. .......... 348/756 |
| 6,154,305 A | 11/2000 | Dickensheets et al. .... 438/24 |
| 6,163,026 A | 12/2000 | Bawolek et al. ....... 250/351 |
| 6,163,402 A | 12/2000 | Chou et al. ............ 359/443 |
| 6,169,624 B1 | 1/2001 | Godil et al. ............ 359/237 |
| 6,172,796 B1 | 1/2001 | Kowarz et al. ......... 359/290 |
| 6,172,797 B1 | 1/2001 | Huibers .................. 359/291 |
| 6,177,980 B1 | 1/2001 | Johnson ................ 355/67 |

| | | | | | | |
|---|---|---|---|---|---|---|
| 6,181,458 B1 | 1/2001 | Brazas, Jr. et al. ......... 359/290 | | 2003/0056078 A1 | 3/2003 | Johansson et al. .......... 711/200 |
| 6,188,519 B1 | 2/2001 | Johnson ...................... 359/572 | | | | |
| 6,195,196 B1 | 2/2001 | Kimura et al. ............... 359/295 | | FOREIGN PATENT DOCUMENTS | | |
| 6,197,610 B1 | 3/2001 | Toda ............................. 438/50 | | | | |
| 6,210,988 B1 | 4/2001 | Howe et al. ................... 438/50 | DE | 197 51 716 A1 | | 5/1998 |
| 6,215,579 B1 | 4/2001 | Bloom et al. ................ 359/298 | DE | 198 46 532 C1 | | 5/2000 |
| 6,219,015 B1 * | 4/2001 | Bloom et al. ................ 345/87 | EP | 0 089 044 A2 | | 9/1983 |
| 6,222,954 B1 | 4/2001 | Riza ............................ 385/18 | EP | 0 261 901 A2 | | 3/1988 |
| 6,229,650 B1 | 5/2001 | Reznichenko et al. ...... 359/566 | EP | 0 314 437 A1 | | 10/1988 |
| 6,229,683 B1 | 5/2001 | Goodwin-Johansoon .... 361/233 | EP | 0 304 263 A2 | | 2/1989 |
| 6,233,087 B1 * | 5/2001 | Hawkins et al. ............. 359/290 | EP | 0 306 308 A2 | | 3/1989 |
| 6,241,143 B1 | 6/2001 | Kuroda ...................... 228/110.1 | EP | 0 322 714 A2 | | 7/1989 |
| 6,243,194 B1 * | 6/2001 | Brazas et al. ................ 359/290 | EP | 0 627 644 A3 | | 9/1990 |
| 6,249,381 B1 | 6/2001 | Suganuma ................... 359/618 | EP | 0 417 039 A1 | | 3/1991 |
| 6,251,842 B1 | 6/2001 | Gudeman .................... 508/577 | EP | 0 423 513 A2 | | 4/1991 |
| 6,252,697 B1 | 6/2001 | Hawkins et al. ............. 359/290 | EP | 0 436 738 A1 | | 7/1991 |
| 6,254,792 B1 | 7/2001 | Van Buskirk et al. ......... 216/13 | EP | 0 458 316 A2 | | 11/1991 |
| 6,261,494 B1 | 7/2001 | Zavracky et al. ............ 264/104 | EP | 0 477 566 A2 | | 4/1992 |
| 6,268,952 B1 | 7/2001 | Godil et al. .................. 359/291 | EP | 0 488 326 A3 | | 6/1992 |
| 6,271,145 B1 | 8/2001 | Toda ............................ 438/706 | EP | 0 499 566 A2 | | 8/1992 |
| 6,271,808 B1 | 8/2001 | Corbin ........................... 345/7 | EP | 0 528 646 A1 | | 2/1993 |
| 6,274,469 B1 | 8/2001 | Yu ................................ 438/592 | EP | 0 530 760 A2 | | 3/1993 |
| 6,282,213 B1 | 8/2001 | Gutin et al. ................... 372/20 | EP | 0 550 189 A1 | | 7/1993 |
| 6,286,231 B1 | 9/2001 | Bergman et al. ............. 34/410 | EP | 0 610 665 A1 | | 8/1994 |
| 6,290,859 B1 | 9/2001 | Fleming et al. ................ 216/2 | EP | 0 627 644 A2 | | 12/1994 |
| 6,290,864 B1 | 9/2001 | Patel et al. .................... 216/79 | EP | 0 627 850 A1 | | 12/1994 |
| 6,300,148 B1 | 10/2001 | Birdsley et al. .............. 438/15 | EP | 0 643 314 A2 | | 3/1995 |
| 6,303,986 B1 | 10/2001 | Shook ......................... 257/680 | EP | 0 654 777 A1 | | 5/1995 |
| 6,310,018 B1 | 10/2001 | Behr et al. ................... 510/175 | EP | 0 658 868 A1 | | 6/1995 |
| 6,313,works B1 | 11/2001 | Cacharelis ................... 349/187 | EP | 0 658 830 A1 | | 12/1995 |
| 6,323,984 B1 | 11/2001 | Trisnadi ..................... 359/245 | EP | 0 689 078 A1 | | 12/1995 |
| 6,327,071 B1 | 12/2001 | Kimura ...................... 359/291 | EP | 0 801 319 A1 | | 10/1997 |
| 6,342,960 B1 | 1/2002 | McCullough ............... 359/124 | EP | 0 851 492 A2 | | 7/1998 |
| 6,346,430 B1 | 2/2002 | Raj et al. ...................... 438/64 | EP | 1 003 071 A2 | | 5/2000 |
| 6,356,577 B1 | 3/2002 | Miller ......................... 372/107 | EP | 1 014 143 A1 | | 6/2000 |
| 6,356,689 B1 | 3/2002 | Greywall ..................... 385/52 | EP | 1 040 927 A2 | | 10/2000 |
| 6,359,333 B1 | 3/2002 | Wood et al. ................. 257/704 | GB | 2 117 564 A | | 10/1983 |
| 6,384,959 B1 | 5/2002 | Furlani et al. ............... 359/291 | GB | 2 118 365 A | | 10/1983 |
| 6,387,723 B1 | 5/2002 | Payne et al. ................... 438/48 | GB | 2 266 385 A | | 10/1993 |
| 6,392,309 B1 | 5/2002 | Wataya et al. ............... 257/796 | GB | 2 296 152 A | | 6/1996 |
| 6,396,789 B1 | 5/2002 | Guerra et al. ................ 369/112 | GB | 2 319 424 A | | 5/1998 |
| 6,418,152 B1 | 7/2002 | Davis ........................... 372/18 | JP | 53-39068 | | 4/1978 |
| 6,421,179 B1 | 7/2002 | Gutin et al. ................. 359/572 | JP | 55-111151 | | 8/1980 |
| 6,438,954 B1 | 8/2002 | Goetz et al. .................. 60/527 | JP | 57-31166 | | 2/1982 |
| 6,445,502 B1 | 9/2002 | Islam et al. .................. 359/571 | JP | 57-210638 | | 12/1982 |
| 6,452,260 B1 | 9/2002 | Corbin et al. ................ 257/686 | JP | 60-49638 | | 3/1985 |
| 6,466,354 B1 | 10/2002 | Gudeman ................... 359/247 | JP | 60-94756 | | 5/1985 |
| 6,479,811 B1 | 11/2002 | Kruschwitz et al. ...... 250/237 G | JP | 60-250639 | | 12/1985 |
| 6,480,634 B1 | 11/2002 | Corrigan ......................... 385/4 | JP | 61-142750 | | 6/1986 |
| 6,497,490 B1 | 12/2002 | Miller ......................... 359/614 | JP | 61-145838 | | 7/1986 |
| 6,525,863 B1 | 2/2003 | Riza ........................... 359/290 | JP | 63-234767 | | 9/1988 |
| 6,563,974 B1 | 5/2003 | Riza ............................ 385/18 | JP | 63-305323 | | 12/1988 |
| 6,565,222 B1 | 5/2003 | Ishii et al. ................... 359/883 | JP | 1-155637 | | 6/1989 |
| 6,569,717 B1 | 5/2003 | Murade ....................... 438/149 | JP | 40-1155637 | | 6/1989 |
| 6,611,366 B1 * | 8/2003 | Islam et al. ................. 359/291 | JP | 2219092 | | 8/1990 |
| 6,639,722 B1 * | 10/2003 | Amm et al. ................. 359/571 | JP | 4-333015 | | 11/1992 |
| 6,663,790 B1 * | 12/2003 | Kowarz et al. ............... 216/24 | JP | 7-281161 | | 10/1995 |
| 6,714,337 B1 * | 3/2004 | Amm ......................... 359/290 | JP | 3288369 | | 3/2002 |
| 6,721,082 B1 * | 4/2004 | Furlani et al. ............... 359/290 | WO | WO 90/13913 | | 11/1990 |
| 2001/0019454 A1 | 9/2001 | Tadic-Galeb et al. ........ 359/649 | WO | WO 92/12506 | | 7/1992 |
| 2002/0015230 A1 | 2/2002 | Pilossof et al. .............. 359/558 | WO | WO 93/02269 | | 2/1993 |
| 2002/0021485 A1 | 2/2002 | Pilossof ...................... 359/295 | WO | WO 93/09472 | | 5/1993 |
| 2002/0079432 A1 | 6/2002 | Lee et al. .................... 250/216 | WO | WO 93/18428 | | 9/1993 |
| 2002/0105725 A1 | 8/2002 | Sweatt et al. ................ 359/566 | WO | WO 93/22694 | | 11/1993 |
| 2002/0112746 A1 | 8/2002 | DeYoung et al. .............. 134/36 | WO | WO 94/09473 | | 4/1994 |
| 2002/0131228 A1 | 9/2002 | Potter | WO | WO 94/29761 | | 12/1994 |
| 2002/0131230 A1 | 9/2002 | Potter ......................... 361/277 | WO | WO 95/11473 | | 4/1995 |
| 2002/0135708 A1 | 9/2002 | Murden et al. ............... 349/19 | WO | WO 96/02941 | | 2/1996 |
| 2002/0176151 A1 | 11/2002 | Moon et al. ................. 359/298 | WO | WO 96/08031 | | 3/1996 |
| 2002/0195418 A1 | 12/2002 | Kowarz et al. | WO | WO 93/41217 | | 12/1996 |
| 2002/0196492 A1 | 12/2002 | Trisnadi et al. | WO | WO 96/41224 | | 12/1996 |
| | | | WO | WO 97/22033 | | 6/1997 |

| | | |
|---|---|---|
| WO | WO 97/26569 | 7/1997 |
| WO | WO 98/05935 | 2/1998 |
| WO | WO 98/24240 | 6/1998 |
| WO | WO 98/41893 | 9/1998 |
| WO | WO 99/07146 | 2/1999 |
| WO | WO 99/12208 | 3/1999 |
| WO | WO 99/23520 | 5/1999 |
| WO | WO 99/34484 | 7/1999 |
| WO | WO 99/59335 | 11/1999 |
| WO | WO 99/63388 | 12/1999 |
| WO | WO 99/67671 | 12/1999 |
| WO | WO 00/04718 | 1/2000 |
| WO | WO 00/07225 | 2/2000 |
| WO | WO 01/04674 A1 | 1/2001 |
| WO | WO 01/006297 A3 | 1/2001 |
| WO | WO 01/57581 A3 | 8/2001 |
| WO | WO 02/025348 A3 | 3/2002 |
| WO | WO 02/31575 A2 | 4/2002 |
| WO | WO 02/058111 A2 | 7/2002 |
| WO | WO 02/065184 A3 | 8/2002 |
| WO | WO 02/073286 A2 | 9/2002 |
| WO | WO 02/084375 A1 | 10/2002 |
| WO | WO 02/084397 A3 | 10/2002 |
| WO | WO 03/001281 A1 | 1/2003 |
| WO | WO 03/001716 A1 | 1/2003 |
| WO | WO 03/012523 A1 | 2/2003 |
| WO | WO 03/016965 A1 | 2/2003 |
| WO | WO 03/023849 A1 | 3/2003 |
| WO | WO 03/025628 A2 | 3/2003 |

OTHER PUBLICATIONS

Buhler et al., "Linear Array of Complementary Metal Oxide Semiconductor Double–Pass Metal Micromirrors," Optical Engineering, vol. 36, No. 5, pp. 1391–1398, May 1997.

Gani et al., "Variable Gratings for Optical Switching: Rigorous Electromagnetic Simulation and Design," Optical Engineering, vol. 38, No. 3, pp. 552–557, Mar. 1999.

R. Tepe, et al. "Viscoelastic Spatial Light Modulator with Active Matrix Addressing," Applied Optics, vol. 28, No. 22, New York, USA, pp. 4826–4834, Nov. 15, 1989.

W. Brinker, et al., "Deformation Behavior of Thin Viscoelastic Layers Used in an Active–Matrix–Addressed Spatial Light Modulator," SPIE vol. 1018, pp. 79–85, Germany, 1988.

T. Utsunomiya and H. Sato, "Electrically Deformable Echellette Grating and its Applications to Tunable Laser Resonator," Electronics and Communications in Japan, vol. 63–c, No. 10, pp. 94–100, Japan, 1980.

Burns, D.M. et al., *Development of microelectromechanical variable blaze gratings,* Sensors and Actuators A, pp. 7–15, 1998.

R.N. Thomas, et al., "The Mirror–Matrix Tube: A Novel Light Valve for Projection Displays", IEEE Transactions on Electron Devices, vol. ED–22, No. 9, pp. 765–775, Sep. 1975.

J. Guldberg, et al., "An Aluminum/SiO2/Silicon–on–Sapphire Light Valve Matrix for Projection Displays," Applied Physics Letters, vol. 26, No. 7, pp. 391–393, Apr. 1975.

"Kitchen Computer", IBM Technical Disclosure Bulletin, vol. 37, No. 12, pp. 223–225, Dec. 1994.

"Image Orientation Sensing and Correction for Notepads", Research Disclosure, No. 34788, p. 217, Mar. 1993.

Beck Mason et al., "Directly Modulated Sampled Grating DBR Lasers for Long–Haul WDM Communication Systems" IEEE Photonics Technology Letters, vol. 9, No. 3, Mar. 1997.pp. 377 of 379.

N.J. Frigo et al., "A Wavelength–Division Multiplexed Passive Optical Network with Cost–Shared Components", IEEE Photonics Technology Letters, vol. 6, No. 11, Nov. 1994, pp. 1365 of 1367.

M.S. Goodman et al., "The LAMBDANET Multiwavelength Network: Architecture, Applications, and Demonstrations", IEEE Journal on Selected Areas in Communications, vol. 8, No. 6, Aug. 1990, pp. 995 of 1004.

C.A. Turkatte, "Examining the Benefits of Tunable Lasers for Provisioning Bandwidth on Demand", EuroForum—Optical Components, Feb. 2001, pp. 1 of 10.

R. Plastow, "Tunable Lasers and Future Optical Networks", Forum—Tunable Laser, Aug. 2000, pp. 58 of 62.

Elizabeth Bruce, "Tunable Lasers", Communications, IEEE Spectrum, Feb. 2002, pp. 35 of 39.

M.G. Littman et al., "Spectrally Narrow Pulsed Dye Laser without Beam Expander", Applied Optics, vol. 17, No. 14, Jul. 15, 1978, pp. 2224 of 2227.

Apte et al., "Deformable Grating Light Valves for High Resolution Displays," Solid State Actuator Workshop, Hilton Head, South Carolina, Jun. 13–16, 1994.

Sene et al., "Polysilicon micromechanical gratings for optical modulation," Sensors and Actuators, vol. A57, pp. 145–151, 1996.

Amm et al., "Invited Paper: Grating Light Valve™ Technology: Update and Novel Applications," *SID Digest,* vol. 29, 1998.

Development of Digital MEMS–Based Display Technology Promises Improved Resolution, Contrast, and Speed, XP–000730009, 1997, pp. 33 of 34.

"Micromachined Opto/Electro/Mechanical Systems," Electronic Systems, NASA Tech Briefs, Mar. 1997, pp. 50 & 52.

S.T. Pai, et al., "Electromigration in Metals", Received Jun. 4, 1976, pp. 103–115.

Olga B. Spahn, et al., "High Optical Power Handling of Pop–Up Microelectromechanical Mirrors", Sandi National Laboratories, IEEE 2000, p. 51–52.

David M. Burns, et al. "Optical Power Induced Damage to Microelectromechanical Mirrors", Sensors and Actuators A 70, 1998, p. 6–14.

V.S. Aliev et al., "Development of Si(100) surface roughness at the initial stage of etching in F2 and XeF2 gases: ellipsometric study," Surface Science 442 (1999), pp. 206–214.

Xuan–Qi Wang et al., "Gas–Phase Silicon Etching with Bromine Trifluoride," Depart. of Electrical Engineering, 136–93 California Institute of Technology, 1997 IEEE, pp. 1505–1508.

R. Apte, "Grating Light Valves for High Resolution Displays", Solid State Sensors and Actuators Workshop, Ph D. Dissertation, Stanford University (Jun. 1994).

O. Solgaard, "Integrated Semiconductor Light Modulators for Fiber–Optic and Display Applications", Ph.D. Dissertation, Stanford University Feb., 1992.

J. Neff, "Two–Dimensional Spatial Light Modulators: A Tutorial", Proceeedings of the IEEE, vol. 78, No. 5 (May 1990), pp. 826–855.

R. Gerhard–Multhaupt, "Viscoelastic Spatial Light Modulators and Schlieren–Optical Systems for HDTV Projection Displays" SPIE vol. 1255 Large Screen Projection Displays 11 (1990), pp. 69–78.

R. Gerhard–Multhaput, "Light–Valve Technologies for High–Definition Television Projection Displays", Displays vol. 12, No. 3/4 (1991), pp. 115–128.

O. Solgaard, F. Sandejas, and D. Bloom, "Deformable Grating Optical Modulator," Optics Letters, vol. 17, No. 9, May 1, 1992, New York, USA, pp. 688–690.

F. Sandejas, R. Apte, W. Banyai, and D. Bloom, "Surface Microfabrication of Deformable Grating Valve for High Resolution Displays," The 7$^{th}$ International Conference on Solid–State Sensors and Actuators.

P. Alvelda, "High–Efficiency Color Microdisplays," SID 95 Digest, pp. 307–311, 1995.

Worboys et al., "Miniature Display Technology for Integrated Helmut Systems," GEC Journal of Research, vol. 10, No. 2, pp. 111–118, Chelmsford, Essex, GB 1993.

M. Farn et al., "Color Separation by use of Binary Optics," Optics Letters, vol. 18:15 pages 1214–1216, 1993.

P. Alvelda, "VLSI Microdisplays and Optoelectric Technology," MIT, pp. 1–93, 1995.

P. Alvelda, "VLSI Microdisplay Technology," Oct. 14, 1994.

Harold F. Winters, "Etch products from the reaction of XeF2 with SiO2, Si3N4, SiC, and Si in the presence of Ion Bombardment," IBM Research Laboratory, 1983 American Vacuum Society, pp. 927–931.

F.A. Houle, "Dynamics of SiF4 desorption during etching of silicon by XeF2," J. Chem. Phys. 87 (3), Aug. 1, 1987, pp. 1866–1872.

Mehran Mehregany, "Microelectromechanical Systems," 1993 IEEE, pp. 14–22.

D. Moser et al., "A CMOS Compatible Thermally Excited Silicon Oxide Beam Resonator with Aluminium Mirror," Physical Electronics Laboratory, 1991 IEEE, pp. 547–550.

M. Parameswaran et al., "Commercial CMOS Fabricated Integrated Dynamic Thermal Scene Simulator," 1991 IEEE, pp. 29.4.1–29.4.4.

M. Parameswaran et al., "CMOS Electrothermal Microactuators," Depart. of Electrical Engineering, 1990 IEEE, pp. 128–131.

U. Streller et al., "Selectivity in dry etching of Si(100) with XeF2 and VUV light," Applied Surface Science 106, (1996), pp. 341–346.

M.J.M Vugts et al., "Si/XeF2 etching: Temperature dependence," 1996 American Vacuum Society, pp. 2766–2774.

P. Krummenacher et al., "Smart Temperature Sensor in CMOS Technology," Sensors and Actuators, A–21–A–23 (1990), pp. 636–638.

Henry Baltes, "CMOS as sensor technology," Sensors and Actuators A. 37–38, (1993), pp. 51–56.

Thomas Boltshauser et al., "Piezoresistive Membrane Hygrometers Based on IC Technology," Sensor and Materials, 5, 3, (1993), pp. 125–134.

Z. Parpia et al., "Modelling of CMOS Compatible High Voltage Device Structures," pp. 41–50.

Jon Gildemeister, "Xenon Difluoride Etching System," 1997, UC Berkeley MicroTabrication Manual Chapter 7.15, p. 2–5.

W. Riethmuller et al., "A smart accelerometer with on–chip electronics fabricated by a commercial CMOS process," Sensors and Actuators A. 31, (1992), 121–124.

W. Gopel et al., "Sensors—A Comprehensive Survey," vol. 7, Weinheim New York, 44 pgs.

D. E. Ibbotson et al., "Comparison of XeF2 and F–atom reations with Si and SiO2," 1984 American Institute of Physics, pp. 1129–1131.

D. E. Ibbotson et al., "Plasmaless dry etching of silicon with fluorine–containing compounds," 1984 American Institute of Physics, pp. 2939–2924.

M.H. Hecht et al., "A novel x–ray photoelectron spectroscopy study of the Al/SiO2 interfaces," 1985 American Institute of Physics, pp. 5256–52616.

Daniel L. Flamm et al., "XeF2 and F–Atom Reactions with Si: Their Significance for Plasma Etching.," Solid State Technology, V. 26, #4, 4/83, pp. 117–121.

H.F. Winters et al., "The etching of silicon with XeF2 vapor," Appl. Phys. Lett. vol. 34, No. 1, Jan. 1979, pp. 70–73.

Wayne Bailey et al., "Microelectronic Structures and Microelectromechanical Devices for Optical Processing and Multimedia Applications," SPIE—The International Society for Optical Engineering, vol. 2641, Oct. 1995, 13 pgs.

J. Marshall et al., "Realizing Suspended Structures on Chips Fabricated by CMOS Foundry Processes Through the MOSIS Service," National Inst. of Standards and Technology, Jun. 94, 63 pgs.

David Moser et al., "CMOS Flow Sensors," 1993 Physical Electroncis Lab, Swiss Federal Institute of Tech. Zurich, Switzerland, 195 pgs.

E. Hecht, "Optics", Addison–Wesley, 2$^{nd}$ edition, 1987, Adelphi University, pp. 163–169, 358–360.

T. Glaser et al., "Beam switching with binary single–order diffractive grating", XP–000802142, Optics Letters, Dec. 15, 1998, vol. 23, No. 24, pp. 1933 of 1935.

P.C. Kundu et al., "Reduction of Speckle Noise by Varying the Polarisation of Illuminating Beam", XP–002183475, Dept. of Applied Physics, Calcutta University, 1975, pp. 63–67.

J. W. Goodman, "Some Fundamental Properties of Speckle", XP–002181682, Dept. of Electrical Engineering, Stanford University, 1976, pp. 1146–1150.

Lingli Wang et al., "Speckle Reduction in Laser Projection Systems by Diffractive Optical Elements", XP–000754330, Applied Optics, Apr. 1, 1998, vol. 37, No. 10, pp. 1770–1775.

R.W. Corrigan et al., "Calibration of a Scanned Linear Grating Light–Valve, Projection System for E–Cinema Applications", Silicon Light Machines, SID '99, San Jose, CA, 27 pp. 1999.

R. W. Corrigan et al., "Calibration of a Scanned Linear Grating Light–Valve, Projection System", Silicon Light Machines, San Jose, CA, 4 pgs, May 18, 1999.

"Introduction to Cryptography", http://www.ssh.fi/tech/crpto/into.html, 35 pgs, Jun. 21, 1999.

"Deep Sky Black," Equinox Interscience, www.eisci.com/deepsky.html, 1997.

"Absorptive Neutral Density Filters," Newport Corp., Irvine, CA, www.newport.com, May 7, 1999.

"High Energy Variable Attenuators," Newport Corp., Irvine, CA, www.newport.com, May 7, 1999.

"Neutral–Density Filters," New Focus, Inc., Santa Clara, CA, www.newfocus.com, May 7, 1999.

J. Hawkes et al., "Laser Theory and Practice," Prentice Hall, New York, 1995, pp. 407–408.

C. Tew et al., "Electronic Control of a Digital Micromirror Device for Projection Displays", Proceedings of the 1994 IEEE International Solid–State Circuits Conference, 1994.

Henck, S.A., "Lubrication of Digital Mircomirror Devices™", Tribology Letters, No. 3, pp. 239–247, 1997.

K. W. Goossen et al., "Silicon Modulator Based on Mechanically–Active Anti–Reflection Layer with 1 Mbit/sec Capability for Fiber–in–the–Loop Applications", IEEE Protonics Technology Letters, vol. 6, No. 9, Sep. 1994, pp. 1119–1121.

J.A. Walker et al., "Demonstration of a Gain Flattened Optical Amplifier with Micromechanical Equalizer Element", Lucent Technologies, pp. 13–14.

A. P. Payne et al., "Resonance Measurements of Stresses in $Al/si_3N_4$ Micro–Ribbons", Silicon Light Machines, Sep. 22, 1999, 11 pgs.

M. W. Miles, "A New Reflective FPD Technology Using Interferometric Modulation", 4 pgs.

N. A. Riza et al., "Digitally Controlled Fault–Tolerant Multiwavelength Programmable Fiber–Optic Attenuator Using a Two–Dimensional Digital Micromirror Device", Optics Letters, Mar. 1, 1999, vol. 24, No. 5, pp. 282–284.

N. A. Riza et al., "Synchronous Amplitude and Time Control for an Optimum Dynamic Range Variable Photonic Delay Line", Applied Optics, Apr. 10, 1999, vol. 38, No. 11, pp. 2309–2318.

P. Alvelda et al., "44.4: Ferroelectric Microdisplays Using Distortion–Compensated Pixel Layouts", SID 95 Digest, XP 2020715, pp. 931–933.

* cited by examiner

"Pre-Bias" operation mode

US 7,042,611 B1

PRE-DEFLECTED BIAS RIBBONS

FIELD OF THE INVENTION

The present invention relates to mitigating the effects of voltage error on light diffraction. More particularly, this invention relates to a grating light valve array structure for light diffraction error mitigation due to voltage error.

BACKGROUND OF THE INVENTION

Designers and inventors have sought to develop a light modulator which can operate alone or together with other modulators. Such modulators should provide high operating speeds, a high contrast ratio or modulation depth, have optical flatness, be compatible with VLSI processing techniques, be easy to handle and be relatively low in cost. Two such related systems are found in U.S. Pat. No. 5,311,360 and 5,841,579 which are hereby incorporated by reference.

According to the teachings of the '360 and '579 patents, a diffractive light modulator is formed of a multiple mirrored-ribbon structure. An example of such a diffractive light modulator 10 is shown in FIG. 1. The diffractive light modulator 10 comprises elongated elements 12 suspended by first and second posts, 14 and 16, above a substrate 20. The substrate 20 comprises a conductor 18. In operation, the diffractive light modulator 10 operates to produce modulated light selected from a reflection mode and a diffraction mode.

FIGS. 2 and 3 illustrate a cross-section of the diffractive light modulator 10 in a reflection mode and a diffraction mode, respectively. The elongated elements 12 comprise a conducting and reflecting surface 22 and a resilient material 24. The substrate 20 comprises the conductor 18.

FIG. 2 depicts the diffractive light modulator 10 in the reflection mode. In the reflection mode, the conducting and reflecting surfaces 22 of the elongated elements 12 form a plane so that incident light I reflects from the elongated elements 12 to produce reflected light R.

FIG. 3 depicts the diffractive light modulator 10 in the diffraction mode. In the diffraction mode, voltage applied to alternate ones of the elongated elements 12 causes those alternating elongated elements 12 to move toward the substrate 20. The charged alternating elongated elements are referred to as the "active" elements. The voltage is applied between the reflecting and conducting surfaces 22 of the alternate active ones of the elongated elements 12 and the conductor 18. The voltage results in a height difference between the alternate active ones of the elongated elements 12 and noncharged or "bias" ones of the elongated elements 12. A height difference of a quarter wavelength $\lambda/4$ of the incident light I produces maximum diffracted light including plus one and minus one diffraction orders, $D_{+1}$, and $D_{-1}$.

FIGS. 2 and 3 depict the diffractive light modulator 10 in the reflection and diffraction modes, respectively. For a deflection of the alternate ones of the elongated elements 12 of less than a quarter wavelength $\lambda/4$, the incident light I both reflects and diffracts producing the reflected light R and the diffracted light including the plus one and minus one diffraction orders, $D_{+1}$, and $D_{-1}$. In other words, by deflecting the alternate ones of the elongated elements 12 less the quarter wavelength $\lambda/4$, the diffractive light modulator 10 produces a variable reflectivity.

FIG. 4 depicts a graphical representation of diffraction of $0^{th}$ order light of the diffractive light modulator 10 at various active ribbon voltages with respect to intensity and attenuation. The active ribbon voltage 30 is graphically represented along the horizontal axis in Volts(V) and a normalized intensity 32 scale and attenuation 34 scale in decibels (dB) are shown along each vertical axis. Both the intensity graph 36 and the attenuation graph 38 have large negative slopes that decrease drastically as the active ribbon voltage 30 exceeds 10V. FIG. 4 is a representation of how voltage error, as will be discussed below, affects the performance of the diffractive light modulator 10.

Unfortunately, diffractive light modulators 10 are sensitive to voltage errors that may occur in normal operation. Specifically, there is a large dependence of attenuation with active ribbon voltage. This is particularly a problem at larger attenuations (−15 dB) where the dependence exceeds 10 dB per volt. Such error makes it extremely difficult to diffract the proper amount of light from the diffractive light modulator 10 in that the electrical bias applied to every other one of the elongated elements 12 will have an additional voltage component. This additional voltage will separate the active and bias elongated elements 12 more or less than the desired amount, thereby causing light diffraction inconsistent with the desired operation of the diffractive light modulator 10.

The non-linearity in the voltage versus attenuation behavior places severe design constraints on the voltage source. A stable, high bit-depth voltage supply or precision non-linear supply is required for control of the attenuation level. For attenuation applications, a key metric of performance is the slope of the attenuation versus voltage response, namely decibels per volt (dBN). A low and constant dBN is desired. FIG. 4 illustrates a less desirable performance—varying slope, and high slope at larger attenuation levels.

Lastly, current diffractive light modulators 10 are sensitive to voltage errors caused by power supply noise. Such error is often referred to as "ripple." What is needed is a diffractive light modulator 10 that is less sensitive to ripple in order to diffract a correct amount of light

SUMMARY OF THE INVENTION

According to the embodiments of the present invention, a modulator and method for modulating an incident beam of light including a plurality of active elements, each active element including a first end, a second end, and a light reflective planar surface with the light reflective planar surfaces of the plurality of active elements lying in a first parallel plane wherein the plurality of active elements are parallel to each other. The modulator also includes a plurality of bias elements, each bias element including a first end and a second end, and a light reflective planar surface with the light reflective planar surfaces of the plurality of bias elements lying in a second parallel plane wherein the plurality of bias elements are parallel to each other and further wherein the plurality of bias elements are mechanically or electrically deflected with respect to the plurality of active elements.

Lastly, the modulator includes a support structure coupled to each end of the plurality of active elements and to each end of the plurality of bias elements to maintain a position of each active and bias element relative to each other and to enable movement of selective ones of the plurality of active elements and the plurality of bias elements in a direction normal to the one or more parallel planes of the plurality of active and bias elements, and between a first modulator configuration wherein the plurality of active elements and the plurality of bias elements act to reflect the incident beam of light as a plane mirror, and a second modulator configuration wherein the plurality of active elements and the plurality of bias elements act to diffract the incident beam of light.

Each of the plurality of bias elements is deflected an odd multiple of the wavelength of an incident light wave divided by four and the plurality of light reflective planar surfaces of the plurality of active elements move from the first parallel plane to the second parallel plane.

The bias elements can be deflected by applying a voltage difference over each of the plurality of bias elements, or covering the light reflective surface of each of the plurality of bias elements with a transparent over layer, or affixing each of the plurality of bias elements such that the light reflective planar surfaces of the plurality of bias elements are lying in the second parallel plane wherein the plurality of bias elements are parallel to each other or securing the light reflective planar surfaces of each of the plurality of bias elements to a substrate such substrate defining the second parallel plane.

According to the embodiments of the present invention, a modulator for modulating an incident beam of light includes means for supporting a plurality of active elements and a plurality of bias elements, each active and bias element including a first end and a second end, the supporting means being coupled to each end of the plurality of active and bias elements to maintain a position of each active and bias element relative to each other, and a light reflective planar surface with the light reflective planar surfaces of the plurality of active elements lying in a first parallel plane and the plurality of bias elements lying in a second parallel plane wherein the plurality of active and bias elements are parallel to each other and further wherein the plurality of bias elements are deflected with respect to the plurality of active elements.

The modulator also includes means for moving selective ones of the plurality of active elements and the plurality of bias elements in a direction normal to the one or more parallel planes of the plurality of active and bias elements, and between a first modulator configuration wherein the plurality of active elements and the plurality of bias elements act to reflect the incident beam of light as a plane mirror, and a second modulator configuration wherein the plurality of active elements and the plurality of bias elements act to diffract the incident beam of light.

DETAILED DESCRIPTION OF THE EMBODIMENTS

The present invention overcomes deficiencies of conventional diffractive light modulators 10 by deflecting bias elements, commonly referred to as ribbons, at an amount substantially equal to $\lambda/4$ or an odd multiple thereof in order to reverse the characteristics of the $0^{th}$ order light, thereby reducing the sensitivity of the active ribbons to various forms of voltage errors.

Figure 1:
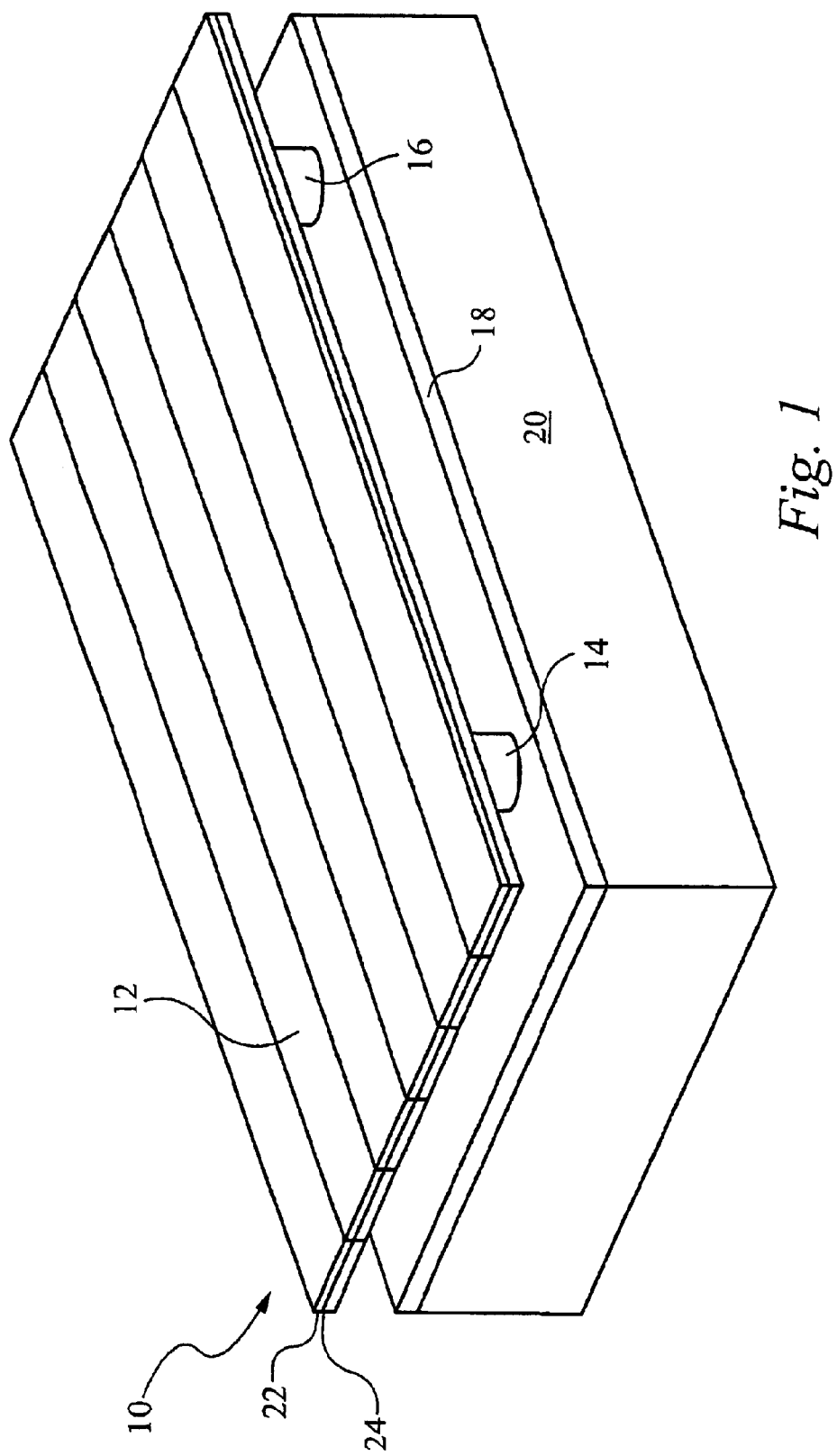
FIG. 1 illustrates an exemplary diffractive light modulator.
Figure 2:
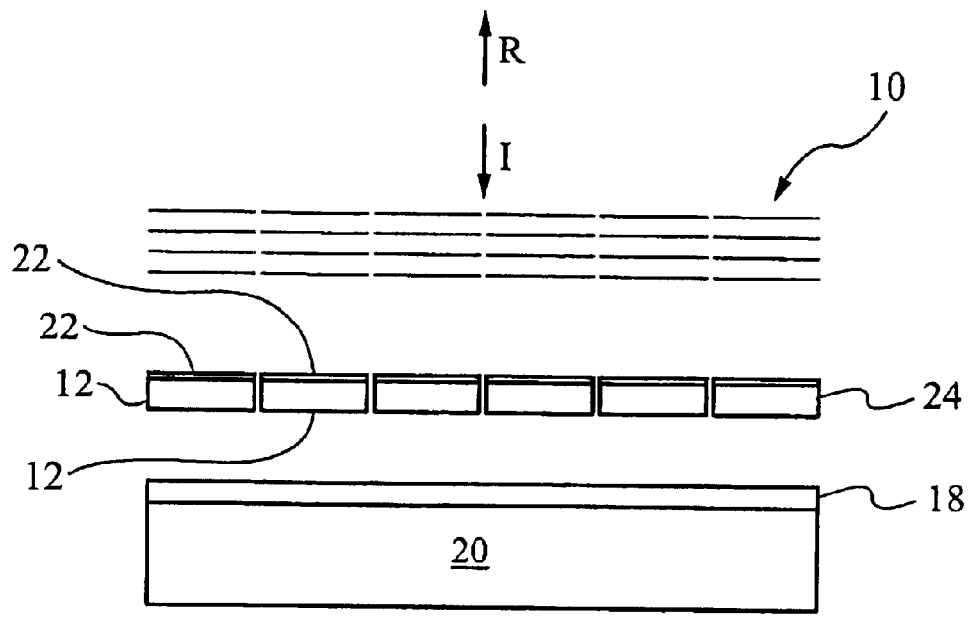
FIG. 2 illustrates a cross-section of the exemplary diffractive light modulator in a reflection mode.
Figure 3:
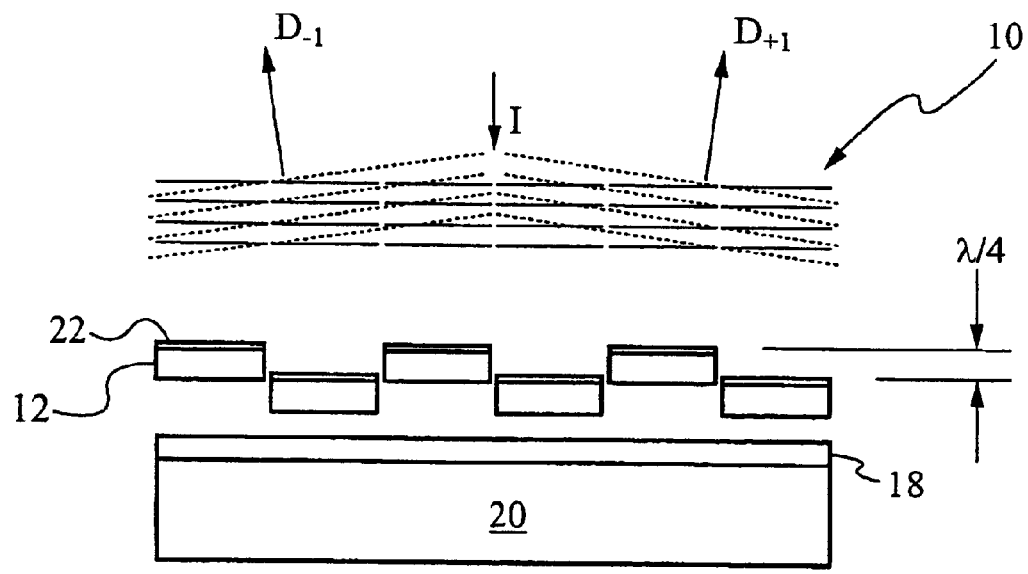
FIG. 3 illustrates a cross-section of the exemplary diffractive light modulator in a diffraction mode.
Figure 4:
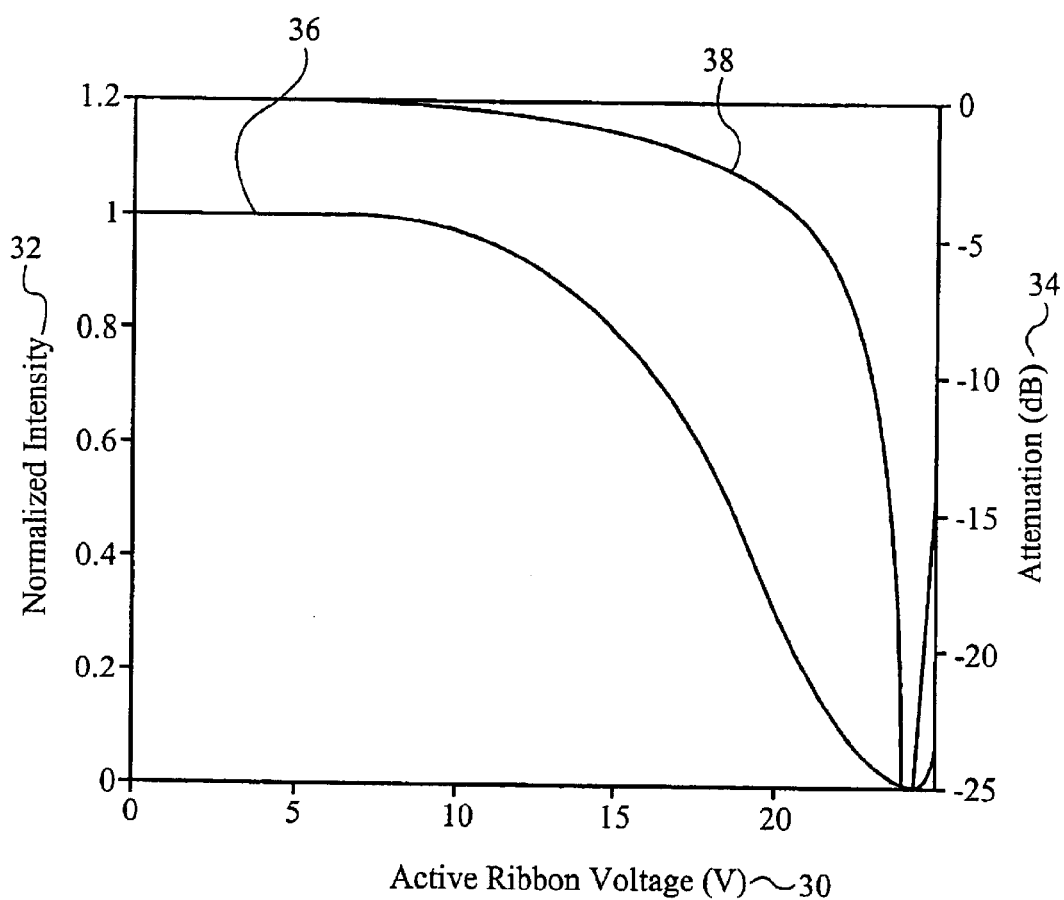
FIG. 4 illustrates a graphical representation of the operation of the exemplary diffractive light modulator
Figure 5:
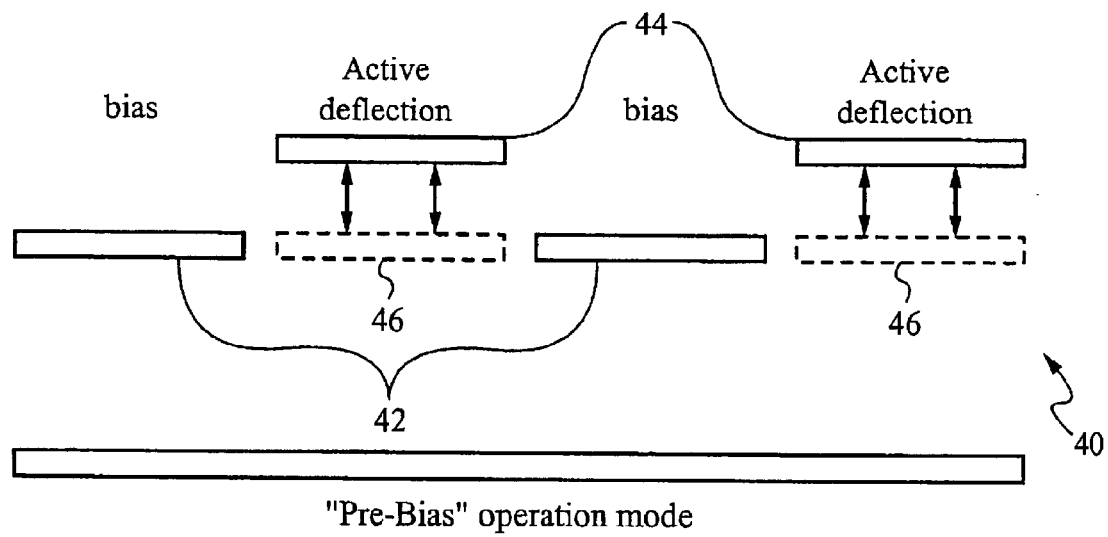
FIG. 5 illustrates a cross-section of the light modulator of the preferred embodiment of the present invention.

FIG. 5 depicts a cross-section of the light modulator 40 of the preferred embodiment of the present invention. The bias ribbons 42 are deflected such that the top surface of each Bias Ribbon is substantially equal to any odd multiple of $\lambda/4$ below the top surface of the active ribbons 44. The active ribbons 44 operate nominally between position 44 and position 46. Voltage errors will cause deflection errors in the active ribbons 44, which in turn, gives an attenuation error. The position or deflection of the bias ribbons 42 can be adjusted to minimize that optical attenuation error. The type of voltage error is not limited to the types discussed above.

Figure 6:
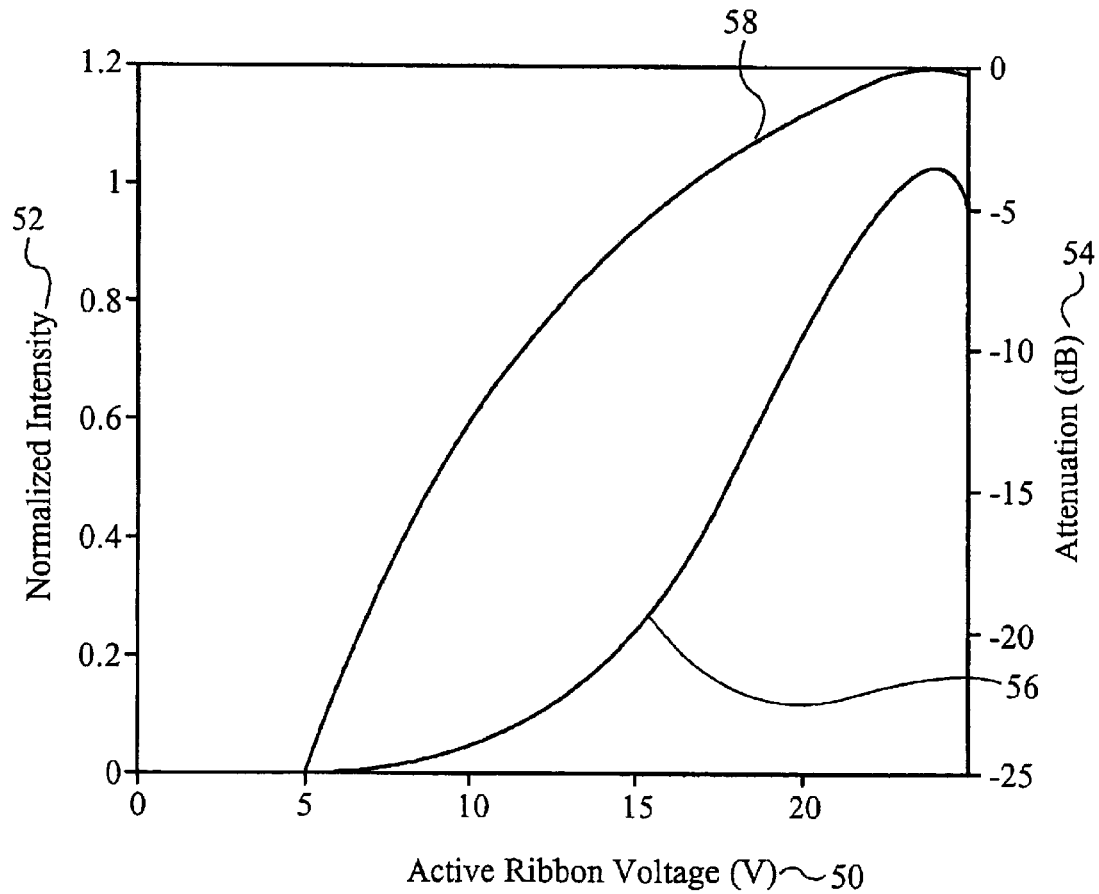
FIG. 6 illustrates a graphical representation of the operation of the light modulator of the preferred embodiment of the present invention.

The preferred embodiment as depicted in FIG. 5 reverses the ON/OFF state of a device operating in $0^{th}$ order, and implements the deflected bias ribbons 42 in a stable, predictable manner, for the total operation lifetime of the light modulator 40. Optimum bias deflection has been found to range from approximate 95% of $\lambda/4$ to 105% $\lambda/4$, and any odd multiples thereof. Deflections in this range show a smooth, near linear response of attenuation dB versus voltage as is depicted in FIG. 6. The large dependence of deflection with voltage (for the active ribbons 44) is moved to the low attenuation (high intensity) state, where it can be better tolerated.

FIG. 6 depicts a graphical representation of diffraction of $0^{th}$ order light of the light modulator 40 of the preferred embodiment of the present invention at various active ribbon voltages with respect to intensity and attenuation. The active ribbon voltage 50 is graphically represented along the horizontal axis in Volts(V) and a normalized intensity 52 scale and attenuation 54 scale in decibels(dB) are shown along each vertical axis. Both the intensity graph 56 and the attenuation graph 58 have slopes with less variation that do not show drastic increase or decrease as the active ribbon voltage 50 increases.

Figure 7:
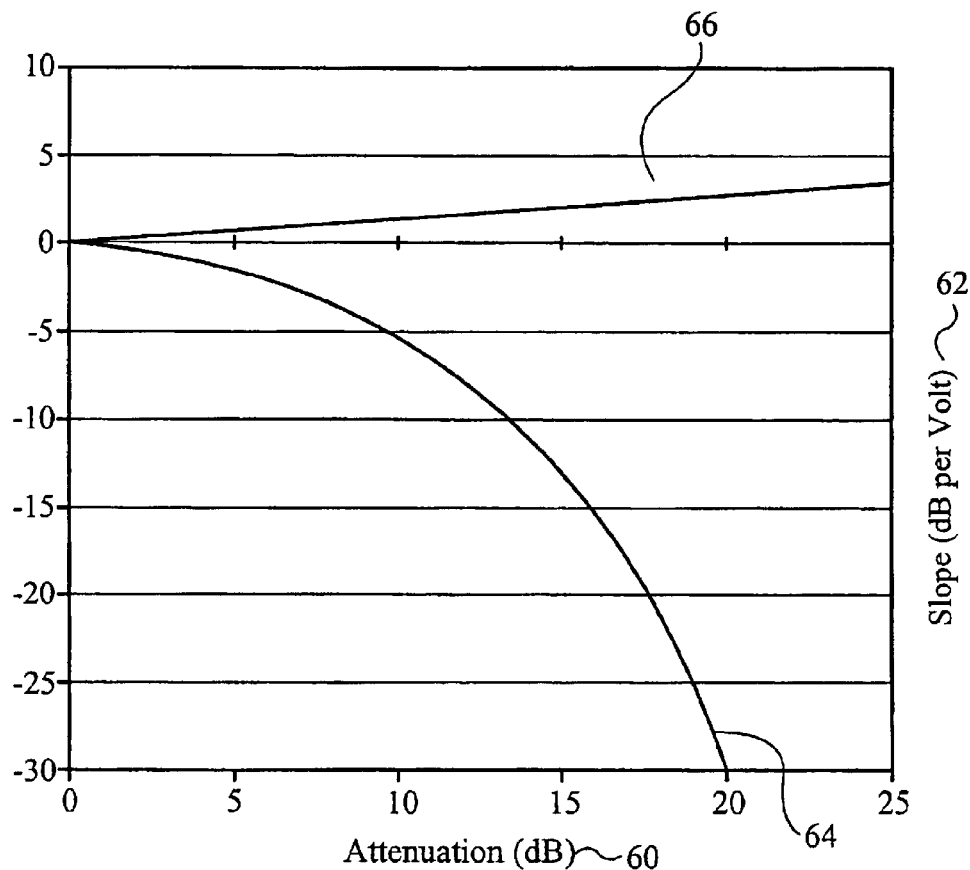
FIG. 7 illustrates a graphical representation of the operation of the light modulator of the preferred embodiment of the present invention.

FIG. 7 is a graphical comparison of the attenuation slopes associated with the operation of the diffractive light modulator 10 having no deflection of the bias ribbons and the light modulator 40 of the preferred embodiment of the present invention having a bias ribbon 42 deflection of λ/4 in order to display the desired slope of dB per Volt to minimize the sensitivity of the light modulator 40. Here, the attenuation 60 scale is graphically represented along the horizontal axis in decibels(dB) and the slope 62 scale in dB per Volt is shown along each vertical axis. The non-deflected bias slope 64 shows an ever decreasing slope as the attenuation 60 value decreases. However, the light modulator 40 of the preferred embodiment of the present invention has a deflected bias slope 66 having desirable characteristics in decreasing sensitivity to the light modulator 40. More specifically, the deflected bias slope 66 is at or near a constant level. Such a slope indicates that the light modulator 40 is operating with decreased sensitivity to voltage error.

Referring back to FIG. 5, a number of methods and configurations can be used to deflect the bias ribbons 42 either mechanically or electrically. In other words, the bias ribbons 42 may be deflected to an amount substantially equal to an odd multiple of the 95%–105% λ/4 range by actually applying a separate voltage of approximately 20V to the bias ribbons 42, thus holding the bias ribbons 42 in a deflected position electrically. This method is advantageous because electrical positioning of the bias ribbons 42 is highly accurate, and can be implemented on most light modulating devices. Furthermore, electrically deflecting the bias ribbons 42 provides an optimum response with respect to the deflected bias slope 66 as graphically demonstrated in FIG. 7.

Also, the bias ribbons 42 may be deflected mechanically by producing a light modulator 40 having bias ribbons 42 that are deflected by a predetermined distance or amount, thereby deflecting the bias ribbons 42 mechanically. The following description will disclose known methods to deflect the bias ribbons 42.

Figure 11A:
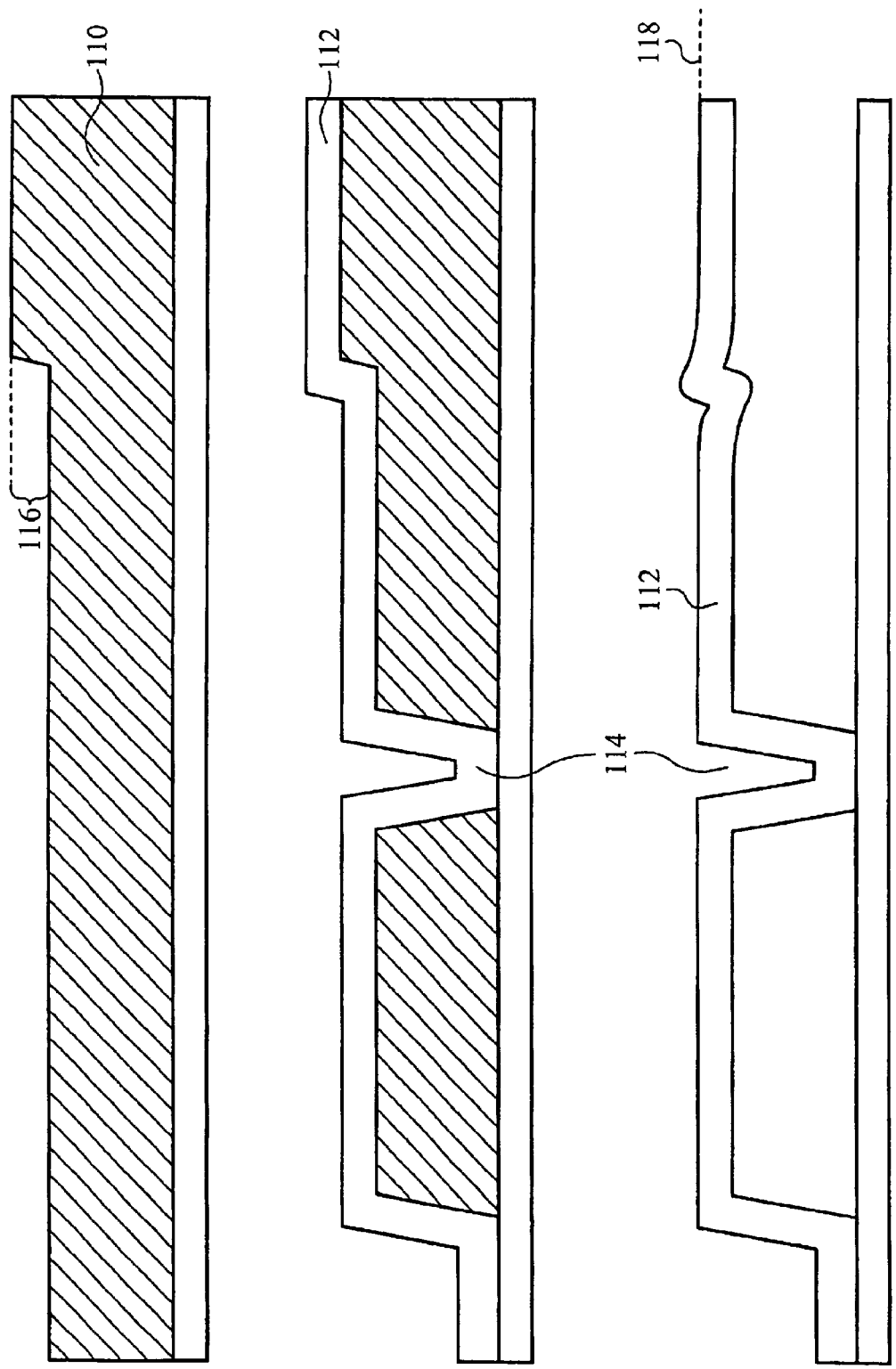
FIG. 11a illustrates a side view of a ribbon constructed according to an embodiment of the present invention.

FIG. 11a depicts a blind etch process of an embodiment of the present invention, wherein a side view of a sacrificial layer 110 is deposited and is etched to an etch depth 116 that reflects the desired deflection level. The posts 114 are then etched and a ribbon layer 112 is deposited. Once the ribbon layer 112 is in place, the sacrificial layer 110 is removed, the ribbon layer 112 is cut and released, creating a ribbon layer having a pre-biased ribbon height 118.

Figure 11B:
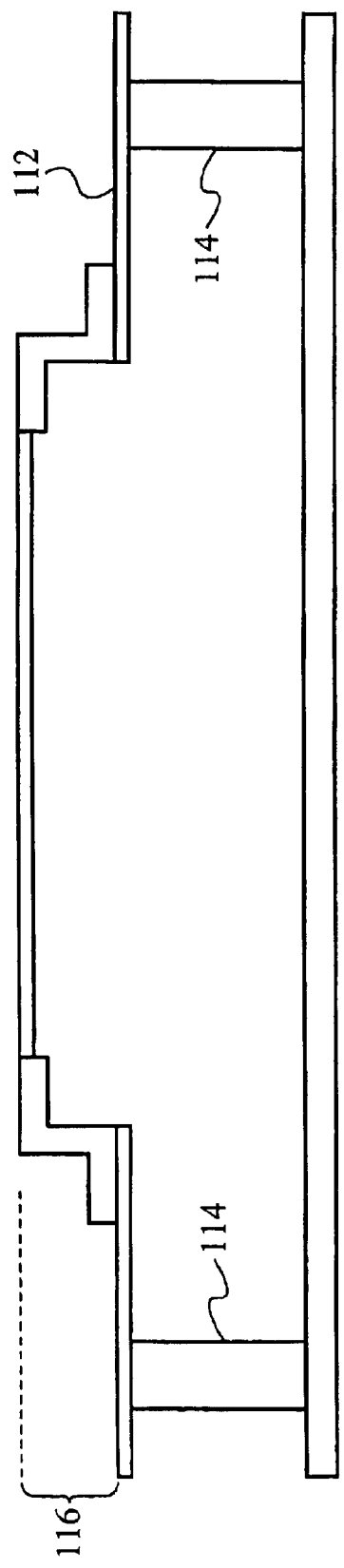
FIG. 11b illustrates a side view of a ribbon constructed according to an embodiment of the present invention.
Figure 11C:
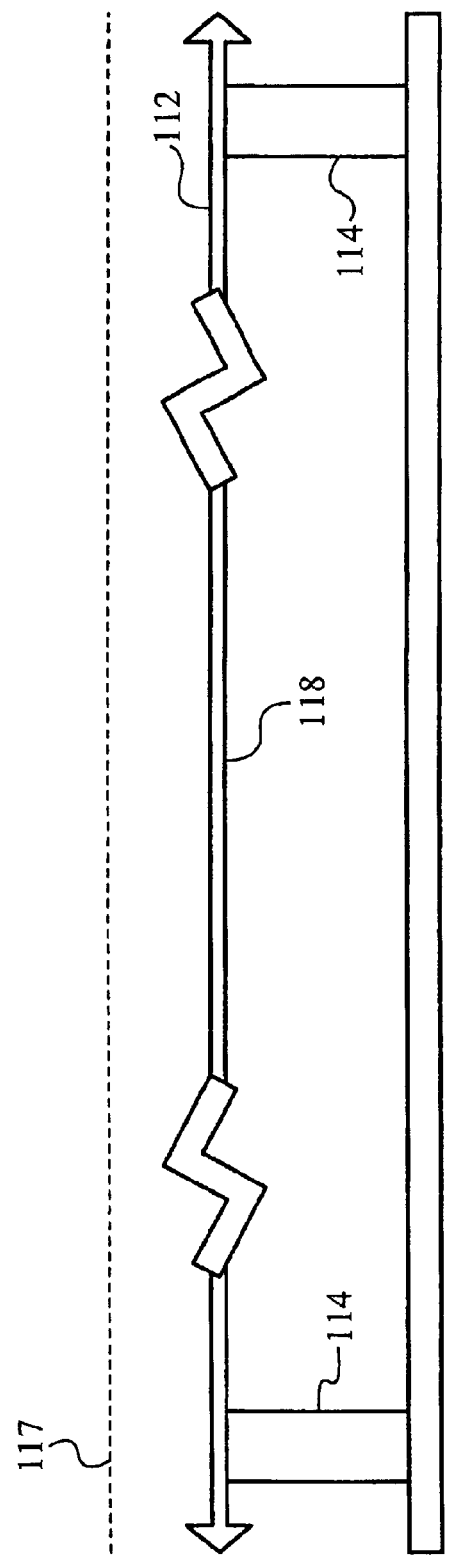
FIG. 11c illustrates a side view of a ribbon constructed according to an embodiment of the present invention.

FIGS. 11b and 11c depict a more detailed side view showing the characteristic effect that this etching has on the ribbon layer 112. In FIG. 11b, the posts 114 are shown supporting a ribbon layer 112 after the sacrificial layer 110 of FIG. 11a has been removed, but before the tension in the ribbon layer 112 has been released. Here, the original etch depth 116 is clearly shown in the ribbon layer 112. FIG. 11c depicts the same ribbon layer 112 after the tension has been released. Naturally, the ribbon layer 112 relaxes to a pre-bias ribbon height 118. The active ribbon height 118, which will be discussed below, depicts the level of the ribbon layer 112 prior to the etching process.

Figure 12:
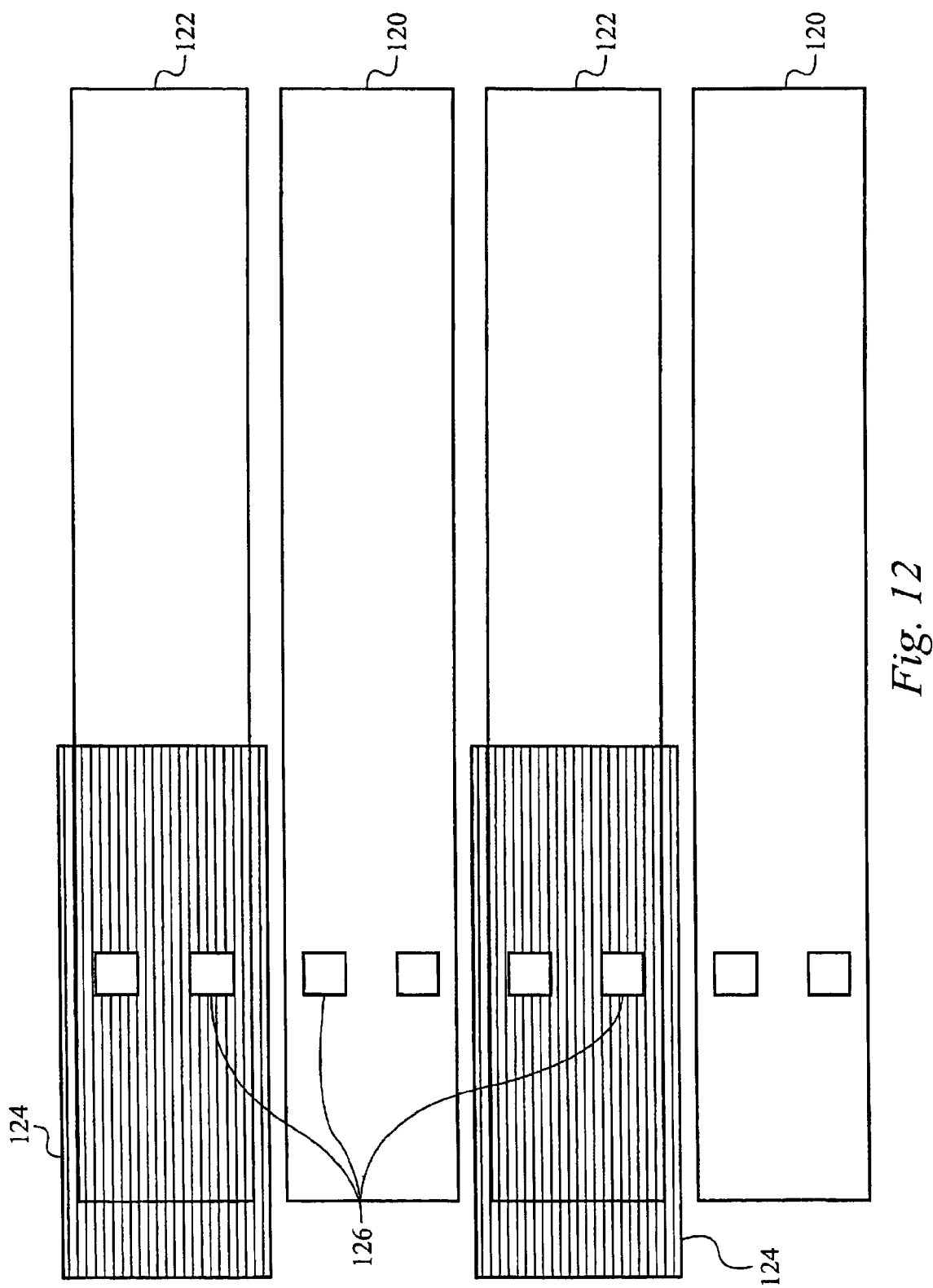
FIG. 12 illustrates a top view of a plurality of ribbons constructed according to an embodiment of the present invention.

FIG. 12 depicts a method of mechanically deflecting the bias ribbons 122 of the preferred embodiment of the present invention. In this figure, a top view of a number of ribbons (bias 122 and active 120) depict how the etching process described above is utilized, by etching the sacrificial layer of every bias ribbon 122. Here, the posts 126 support both the active ribbons 120 and the bias ribbons 122 in a single row. In order to deflect every bias ribbon 122 so that every other ribbon is deflected, the sacrificial layer of each of the bias ribbons 122 is etched as depicted by the etching area 124 as shaded in FIG. 12. The bias ribbons 126 are then deflected as described in the description of FIGS. 11a–c, to the desired etch depth 116 (FIG. 11b). FIG. 12 only depicts one end of the bias ribbons 122 and active ribbons 120 for exemplary purposes only. It will be clear to one skilled in the art that there may be more than the four ribbons depicted, and that the etching process will also occur on the other end of the bias ribbons 122 as described above.

Figure 13:
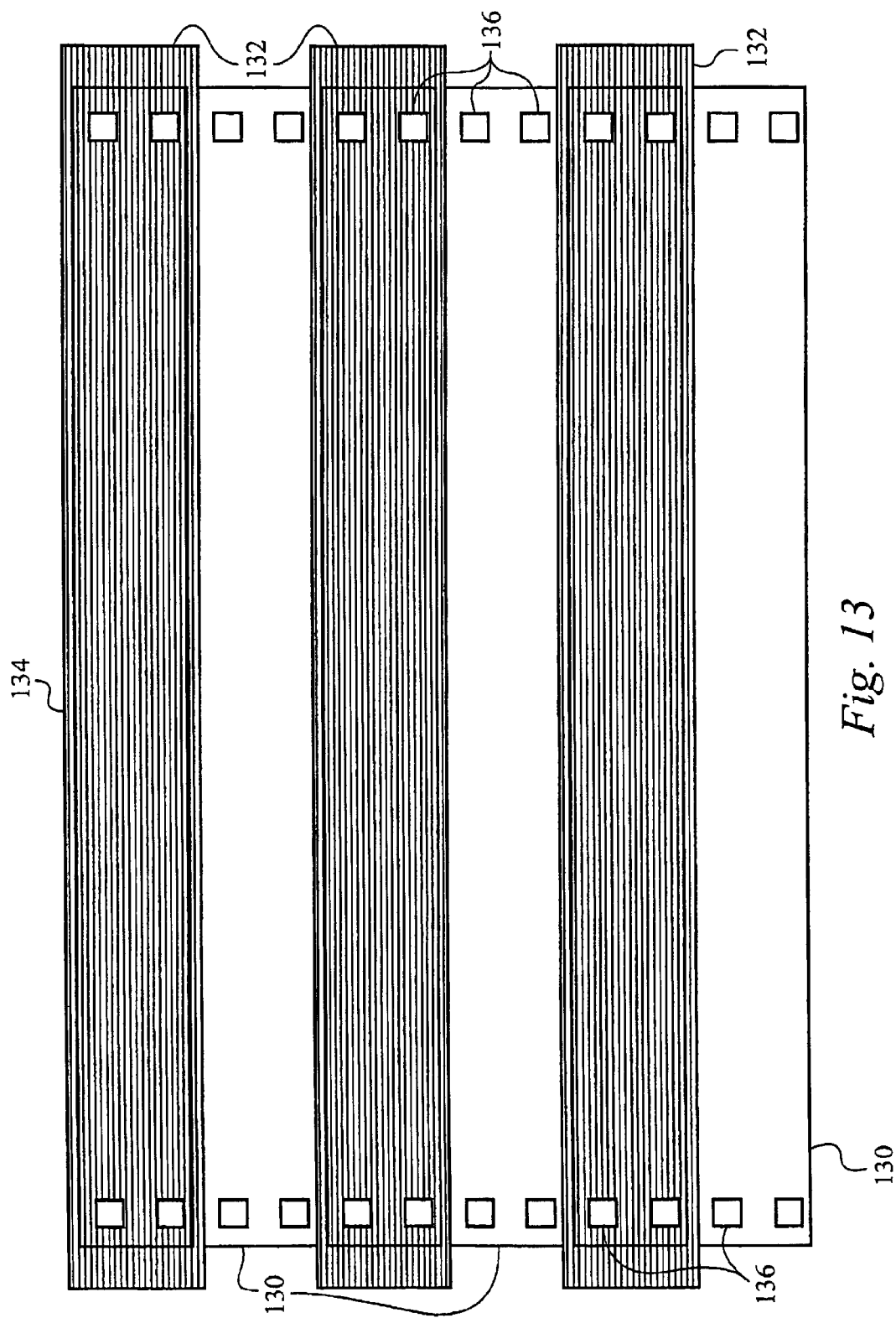
FIG. 13 illustrates a top view of a plurality of ribbons constructed according to an embodiment of the present invention.

FIG. 13 depicts a method of mechanically deflecting the bias ribbons 122 of an additional embodiment of the present invention. Again, the bias ribbons 132 are etched using the method described above. In this embodiment the entire length of the sacrificial layer of each bias ribbon 132 as shown by the etching area 134. Again, the active ribbons 130 are not etched, while the posts 136 remain in two parallel rows at either end of the active and bias ribbons 130, 132. This embodiment allows for deflected bias ribbons 132, while making the etching process easier by expanding the etching area to the entire length of the bias ribbons 132 rather than to a precise etching area 124, as was depicted in FIG. 12.

Figure 14A:
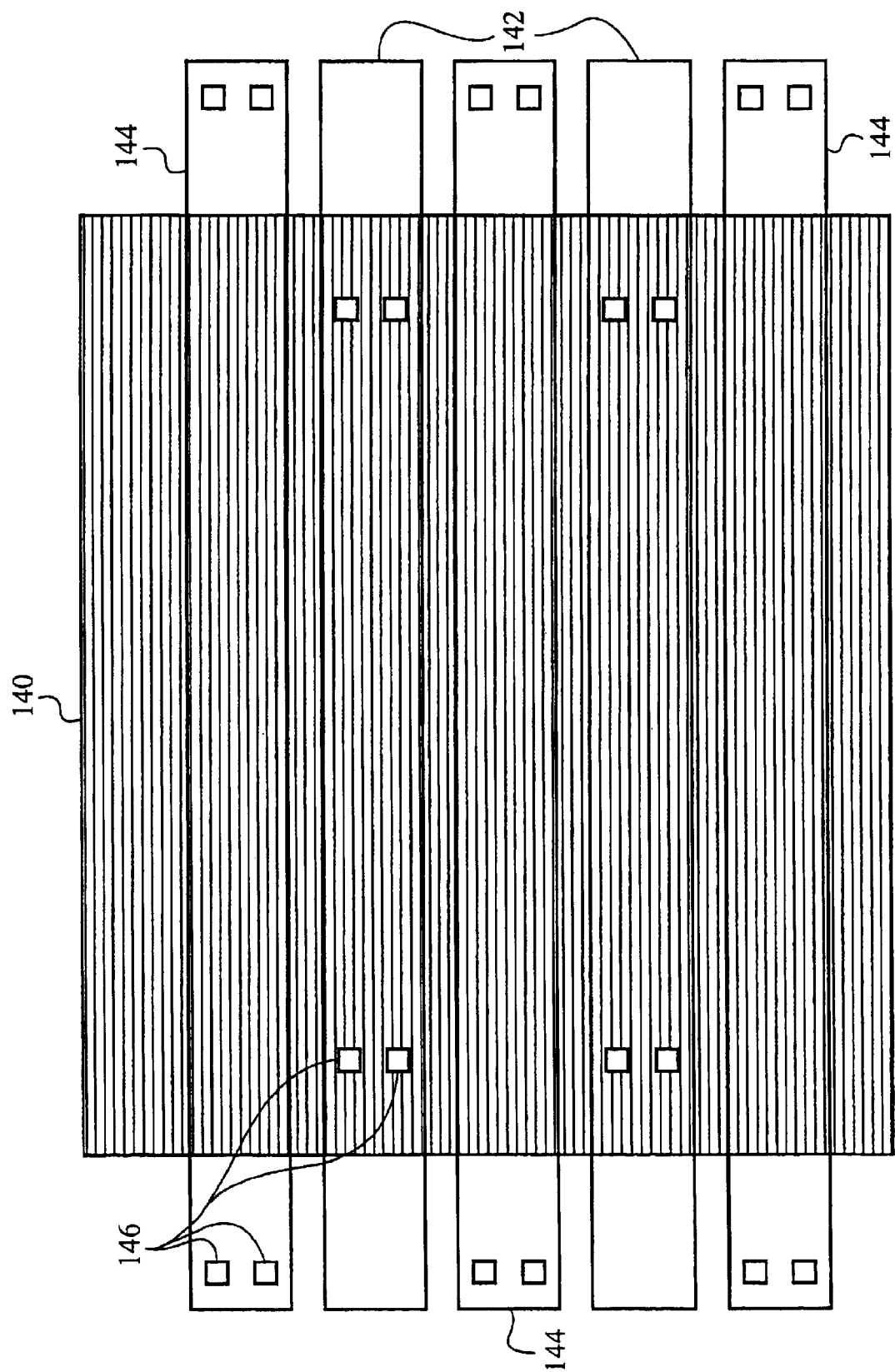
FIG. 14a illustrates a top view of a plurality of ribbons constructed according to an embodiment of the present invention.
Figure 14B:
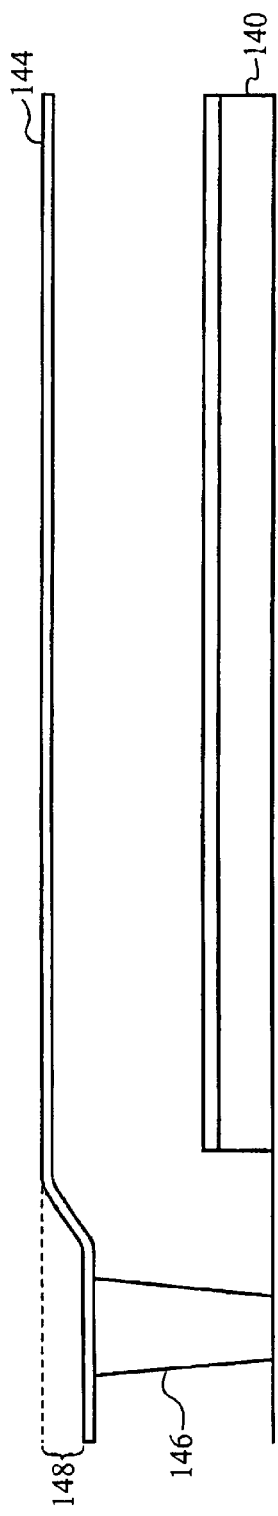
FIG. 14b illustrates a side view of a ribbon constructed according to an embodiment of the present invention.
Figure 14C:
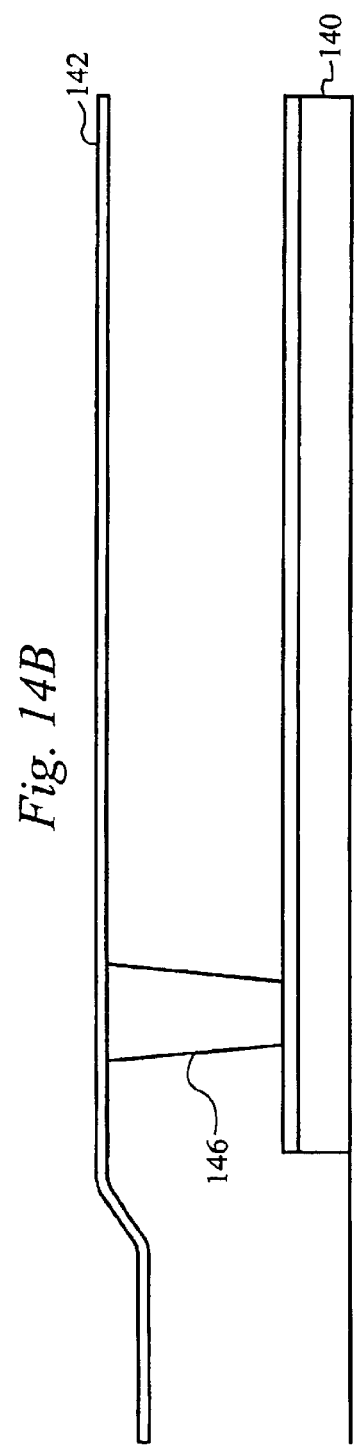
FIG. 14c illustrates a side view of a ribbon constructed according to an embodiment of the present invention.
Figure 14D:
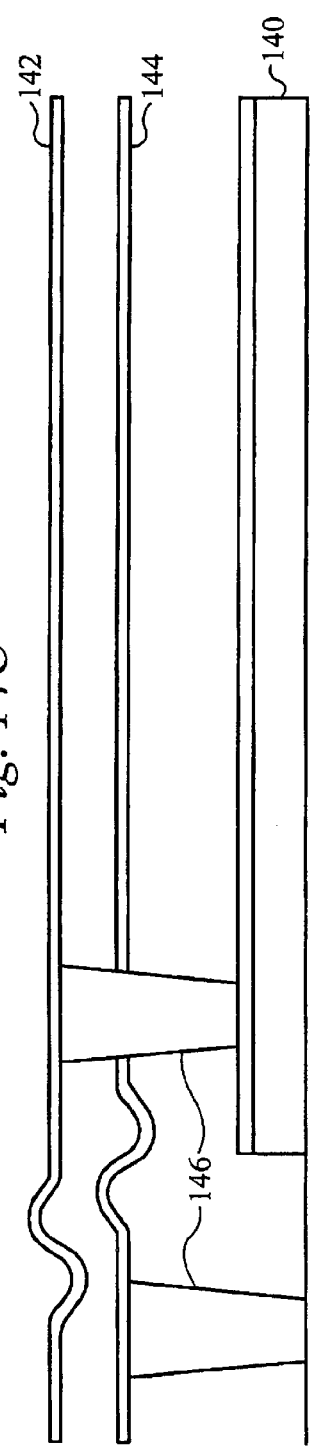
FIG. 14d illustrates a side view of a ribbon constructed according to an embodiment of the present invention.

FIGS. 14a–d depict a method of mechanically deflecting the bias ribbons 144 of an additional embodiment of the present invention. Referring first to the top view of FIG. 14a, the posts 146 are staggered such that the posts 146 of the bias ribbons 144 and the posts of the active ribbons 142 each create their own rows. Further, an LM1 layer 140 is inserted under the active and bias ribbons 142, 144 as shown in FIG. 14a such that the posts 146 of the active ribbons 142 rest on the LM1 layer 140. The LM1 layer is then covered with sacrificial layer and the active and bias ribbons 142, 144 are etched as depicted in FIGS. 14b–d.

Referring now to the side views depicted in FIGS. 14b–d, the LM1 layer 140 is shown supporting the posts 146 of the active ribbons 142, while the etch depth 148 is shown in the bias ribbons 144. Referring to FIG. 14d, as the active and bias ribbons 142, 144 are cut and the pressure is released, the resulting configuration is a deflected bias ribbon 144 as the posts 146 supporting the active ribbons 142 are elevated on the LM1 layer 140.

Figure 15A:
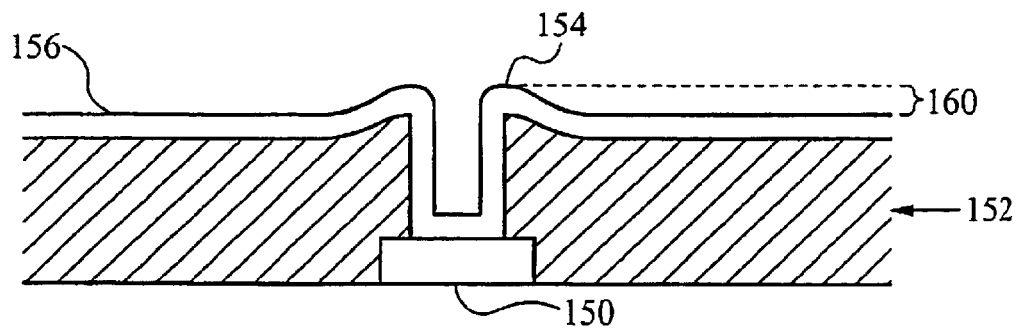
FIG. 15a illustrates a side view of a ribbon constructed according to an embodiment of the present invention.
Figure 15B:
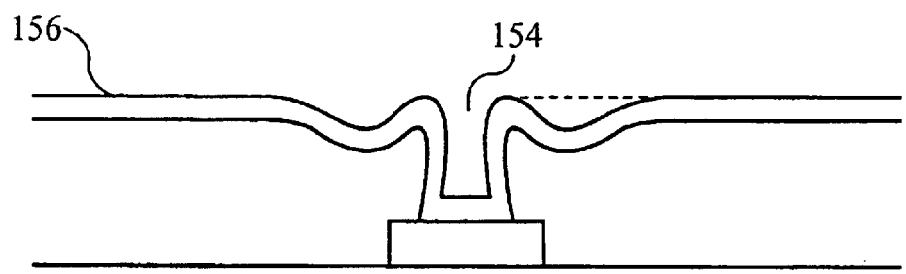
FIG. 15b illustrates a side view of a ribbon constructed according to an embodiment of the present invention.
Figure 15C:
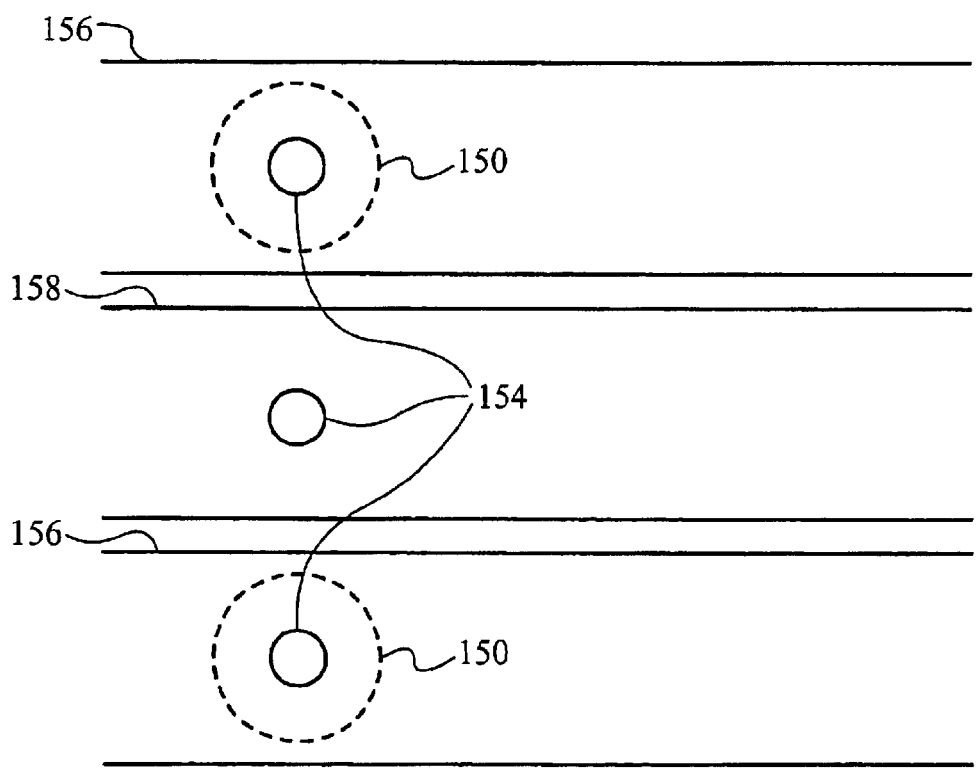
FIG. 15c illustrates a top view of a plurality of ribbons constructed according to an embodiment of the present invention

FIGS. 15a–c depict a method of mechanically deflecting the bias ribbons 158 of an additional embodiment of the present invention. Referring first to the side view of FIG. 15a, the posts 154 of the active ribbons 156 are placed on a pedestal 150, such that the pedestal thickness 160 is defined by the difference between the height of the post 154 and the active ribbon 156. The sacrificial layer 152 is removed, and now referring to FIG. 15b, as the tension is released the active ribbon 156 rises to the level of the elevated post 154. Thus, the bias ribbons 158 are effectively deflected by mechanically raising the level of the active ribbons 156.

Referring now to FIG. 15c, a top view is of this embodiment is depicted such that the active ribbons 156 have a post 154 that is supported by a pedestal 150, while the bias ribbons 158 are supported by a non-elevated post 154. As described above, this embodiment thereby elevates each active ribbon 156, thus effectively deflecting each bias ribbon 158 by mechanical means. Deflected ribbon operation and further embodiments of the present invention will now be discussed below.

Figure 8:
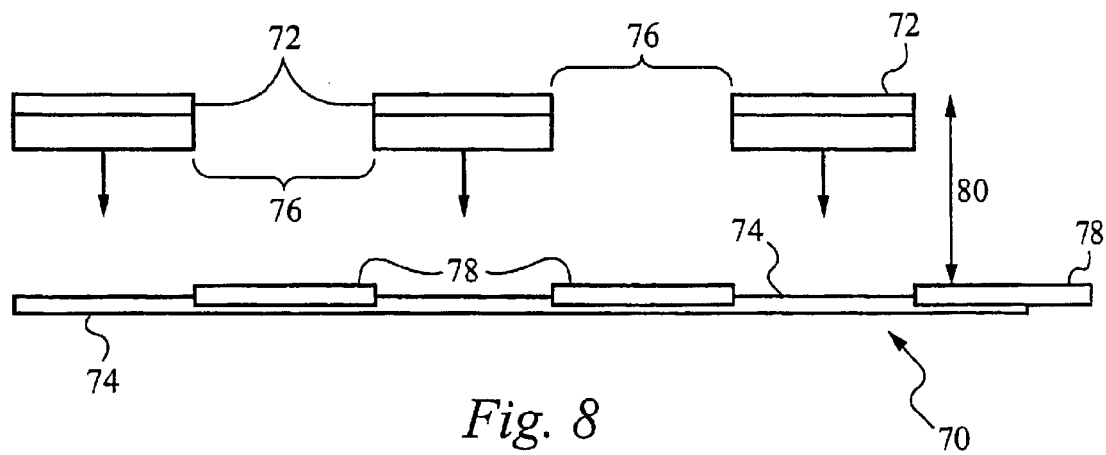
FIG. 8 illustrates a cross-section of the light modulator of an alternative embodiment of the present invention.

FIG. 8 depicts a cross-section of a light modulator 70 according to an alternative embodiment of the present invention. Some light modulators 70 do not include bias ribbons 42 as described in the preferred embodiment, rather only active ribbons 72. A description of this type of light modulator 70 is available in U.S. Pat. No. 5,311,360, which has been incorporated by reference. In this embodiment, a substrate 74 provides a reference reflective surface and the gaps 76 between the active ribbons 72 are the same width as the active ribbons 72. This configuration can be modified mechanically to operate to eliminate light refraction error due to voltage drift, ripple and other voltage error. This can be accomplished by fastening bias ribbons 78 with widths identical to the gaps 76 into the substrate 74. Such a mechanically deflected configuration operates as the bias ribbons 78 in the preferred embodiment of the present invention by creating an Optical Path Difference 80, thereby when the active ribbons 72 receive a voltage error, they deflect to cause phase shift with respect to the substrate 74 and the bias ribbons 78.

Figure 9:
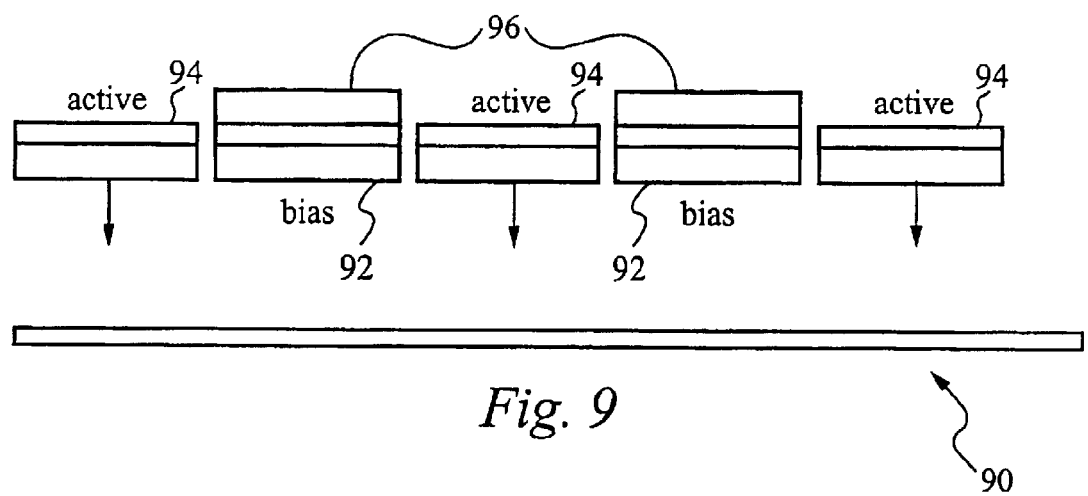
FIG. 9 illustrates a cross-section of the light modulator of an alternative embodiment of the present invention.

FIG. 9 depicts a cross-section of a light modulator 90 according to an alternative embodiment of the present invention. In this embodiment, the bias ribbons 92 are effectively deflected with respect to the active ribbons 94 by covering the bias ribbons 92 with an Overlayer 96. The Overlayer 96 is any of a number of transparent materials having a index of refraction coefficient which will cause a phase shift to incoming light with respect to the active ribbons 94. Ideally, the bias ribbons 92 are covered with an Overlayer 96 which will increase the path length of incident light by a distance substantially equal to the 95%–105% $\lambda/4$ range, or any odd multiple thereof.

Figure 10:
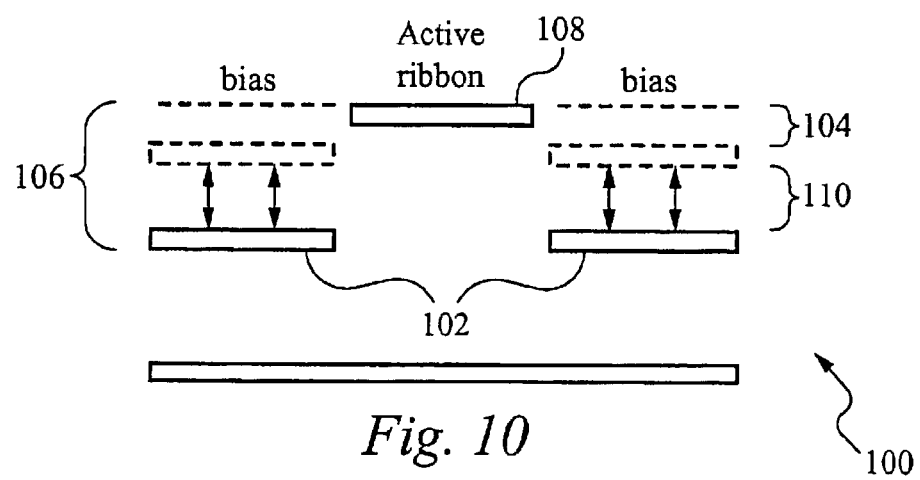
FIG. 10 illustrates a cross-section of the light modulator of an alternative embodiment of the present invention.

FIG. 10 depicts a further cross-section of a light modulator 100 according to an alternative embodiment of the present invention. In this embodiment, the bias ribbons 102 are deflected using a combination of mechanical and electrical deflection. The bias ribbons 102 are deflected a Mechanical Deflection Fraction 104 of the Total Deflection 106 with respect to the active ribbons 108 first through mechanical methods as described above. In other words the Mechanical Deflection Fraction 104 is produced by constructing the light modulator 100 having bias ribbons 102 deflected a Mechanical Deflection Fraction 104 using one of the mechanical disclosures outlined previously in this disclosure. Then a relatively smaller voltage can be applied to the bias ribbons 102 to create the Electrical Deflection Fraction 110. The sum of the Mechanical Deflection Fraction 104 and the Electrical Deflection Fraction 110 achieves a Total Deflection 106 substantially equal to the 95%–105% $\lambda/4$ range, or any odd multiple thereof. It is not a requirement of this embodiment that the Mechanical Deflection Fraction 104 be smaller than the Electrical Deflection Fraction 110 as represented in FIG. 10. In fact, the percentage of each fraction is variable to the extent that their sum is substantially equal to the 95%–105% $\lambda/4$ range, or any odd multiple thereof.

It will be readily apparent to one skilled in the art that other various modifications may be made to the preferred embodiment without departing from the spirit and scope of the invention as defined by the appended claims.

We claim:

1. A modulator for modulating an incident beam of light comprising:
    a. a plurality of active elements, each active element including a first end, a second end, and a light reflective planar surface with the light reflective planar surfaces of the plurality of active elements lying in a first parallel plane wherein the plurality of active elements are parallel to each other;
    b. a plurality of bias elements, each bias element including a first end and a second end, and a light reflective planar surface with the light reflective planar surfaces of the plurality of bias elements lying in a second parallel plane wherein the plurality of bias elements are parallel to each other and further wherein the plurality of bias elements are deflected with respect to the plurality of active elements; and
    c. a support structure coupled to each end of the plurality of active elements and to each end of the plurality of bias elements to maintain a position of each active and bias element relative to each other and to enable movement of selective ones of the plurality of active elements and the plurality of bias elements.

2. The modulator according to claim 1 wherein the support structure enables movement of selective ones of the plurality of active elements and the plurality of bias elements in a direction normal to the one or more parallel planes of the plurality of active and bias elements, and between a first modulator configuration wherein the plurality of active elements and the plurality of bias elements act to reflect the incident beam of light as a plane mirror, and a second modulator configuration wherein the plurality of active elements and the plurality of bias elements act to diffract the incident beam of light.

3. The modulator according to claim 2 wherein each of the plurality of bias elements is deflected an odd multiple of the wavelength of an incident light wave divided by four.

4. The modulator according to claim 3 wherein the plurality of light reflective planar surfaces of the plurality of active elements move from the first parallel plane to the second parallel plane.

5. The modulator according to claim 4 wherein the plurality of bias elements are deflected by applying a voltage difference from ribbon to substrate to each of the plurality of bias elements.

6. The modulator according to claim 4 wherein the plurality of bias elements are effectively deflected by covering the light reflective surface of each of the plurality of bias elements with a transparent over layer.

7. The modulator according to claim 4 wherein the plurality of bias elements are deflected by affixing each of the plurality of bias elements such that the light reflective planar surfaces of the plurality of bias elements are lying in the second parallel plane wherein the plurality of bias elements are parallel to each other.

8. The modulator according to claim 4 wherein the light reflective planar surface of each of the plurality of bias elements is secured to a substrate, such substrate defining the second parallel plane.

9. The modulator according to claim 1 wherein the plurality of bias elements are mechanically deflected by etching a sacrificial layer of each of the plurality of bias elements.

10. The modulator according to claim 1 wherein each of the plurality of active elements is elevated, and further wherein the plurality of bias elements are mechanically deflected by etching a sacrificial layer of each of the plurality of bias elements and each of the plurality of active elements.

11. A method of modulating an incident beam of light comprising:
   a. configuring a plurality of active elements, each active element including a first end, a second end, and a light reflective planar surface with the light reflective planar surfaces of the plurality of active elements lying in a first parallel plane wherein the plurality of active elements are parallel to each other;
   b. deflecting a plurality of bias elements with respect to the plurality of active elements, each bias element including a first end and a second end, and a light reflective planar surface with the light reflective planar surfaces of the plurality of bias elements lying in a second parallel plane wherein the plurality of bias elements are parallel to each other; and
   c. supporting each end of the plurality of active elements and each end of the plurality of bias elements to maintain a position of each active and bias element relative to each other and to enable movement of selective ones of the plurality of active elements and the plurality of bias elements.

12. The method according to claim 11 wherein the movement of selective ones of the plurality of active elements and the plurality of bias elements is in a direction normal to the one or more parallel planes of the plurality of active and bias elements, and between a first modulator configuration wherein the plurality of active elements and the plurality of bias elements act to reflect the incident beam of light as a plane mirror, and a second modulator configuration wherein the plurality of active elements and the plurality of bias elements act to diffract the incident beam of light.

13. The method according to claim 12 wherein each of the plurality of bias elements is deflected an odd multiple of the wavelength of an incident light wave divided by four.

14. The method according to claim 13 further comprising moving the plurality of light reflective planar surfaces of the plurality of active elements from the first parallel plane to the second parallel plane.

15. The method according to claim 14 further comprising applying a voltage difference to each of the plurality of bias elements, thereby causing the plurality of bias elements to deflect.

16. The method according to claim 14 further comprising covering the light reflective surface of each of the plurality of bias elements with a transparent over layer, thereby causing the plurality of bias elements to effectively deflect.

17. The method according to claim 14 further comprising affixing each of the plurality of bias elements such that the light reflective planar surfaces of the plurality of bias elements are lying in the second parallel plane, thereby causing the plurality of bias elements to deflect wherein the plurality of bias elements are parallel to each other.

18. The method according to claim 14 further comprising securing the light reflective planar surface of each of the plurality of bias elements to a substrate, such substrate defining the second parallel plane, thereby causing the plurality of bias elements to effectively deflect.

19. The method according to claim 11 further comprising mechanically deflecting the plurality of bias elements by etching a sacrificial layer of each of the plurality of bias elements.

20. The method according to claim 11 further comprising elevating each of the plurality of active elements, and further comprising mechanically deflecting the plurality of bias elements by etching a sacrificial layer of each of the plurality of bias elements and each of the plurality of active elements.

21. A modulator for modulating an incident beam of light comprising:
   a. means for supporting a plurality of active elements and a plurality of bias elements, each active and bias element including a first end and a second end, the supporting means being coupled to each end of the plurality of active and bias elements to maintain a position of each active and bias element relative to each other, and a light reflective planar surface with the light reflective planar surfaces of the plurality of active elements lying in a first parallel plane and the plurality of bias elements lying in a second parallel plane wherein the plurality of active and bias elements are parallel to each other and further wherein the plurality of bias elements are deflected with respect to the plurality of active elements; and
   b. means for moving selective ones of the plurality of active elements and the plurality of bias elements in a direction normal to the one or more parallel planes of the plurality of active and bias elements, and between a first modulator configuration wherein the plurality of active elements and the plurality of bias elements act to reflect the incident beam of light as a plane mirror, and a second modulator configuration wherein the plurality of active elements and the plurality of bias elements act to diffract the incident beam of light.

22. The modulator according to claim 21 wherein each of the plurality of bias elements is deflected an odd multiple of the wavelength of an incident light wave divided by four.

23. The modulator according to claim 21 wherein the plurality of light reflective planar surfaces of the plurality of active elements move from the first parallel plane to the second parallel plane.

24. The modulator according to claim 21 wherein the plurality of bias elements are mechanically deflected by etching a sacrificial layer of each of the plurality of bias elements.

25. The modulator according to claim 21 wherein each of the plurality of active elements is elevated, and further wherein the plurality of bias elements are mechanically deflected by etching a sacrificial layer of each of the plurality of bias elements and each of the plurality of active elements.

* * * * *